(12) United States Patent
Hwang et al.

(10) Patent No.: US 11,107,828 B2
(45) Date of Patent: Aug. 31, 2021

(54) SEMICONDUCTOR MEMORY DEVICES AND METHODS OF FABRICATING THE SAME

(71) Applicant: Samsung Electronics Co., Ltd., Suwon-si (KR)

(72) Inventors: Sung-Min Hwang, Hwaseong-si (KR); Joon-Sung Lim, Seongnam-si (KR); Eunsuk Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/902,575

(22) Filed: Jun. 16, 2020

(65) Prior Publication Data

US 2020/0312862 A1 Oct. 1, 2020

Related U.S. Application Data

(62) Division of application No. 15/982,001, filed on May 17, 2018, now Pat. No. 10,727,244.

(30) Foreign Application Priority Data

Jun. 12, 2017 (KR) .................. 10-2017-0073390
Nov. 6, 2017 (KR) .................. 10-2017-0146813

(51) Int. Cl.
*H01L 27/11573* (2017.01)
*H01L 27/1157* (2017.01)
(Continued)

(52) U.S. Cl.
CPC .... *H01L 27/11573* (2013.01); *H01L 25/0657* (2013.01); *H01L 27/1157* (2013.01);
(Continued)

(58) Field of Classification Search
CPC .......... H01L 27/1157; H01L 27/11573; H01L 27/11575; H01L 27/11578;
(Continued)

(56) References Cited

U.S. PATENT DOCUMENTS 6,071,763 A 6/2000 Lee
7,345,898 B2 3/2008 Park et al.
(Continued)

FOREIGN PATENT DOCUMENTS

JP H10-242410 A 9/1998
JP 2001-53173 A 2/2001
(Continued)

OTHER PUBLICATIONS

U.S. Office Action dated Aug. 7, 2018 issued in co-pending U.S. Appl. No. 15/841,762.
(Continued)

*Primary Examiner* — Thanhha S Pham
(74) *Attorney, Agent, or Firm* — Harness, Dickey & Pierce, P.L.C.

(57) ABSTRACT

A semiconductor memory device includes a first semiconductor chip and a second semiconductor chip. Each semiconductor chip of the first and second semiconductor chips may include a cell array region and a peripheral circuit region. The cell array region may include an electrode structure including electrodes sequentially stacked on a body conductive layer and vertical structures extending through the electrode structure and connected to the body conductive layer. The peripheral circuit region may include a residual substrate on the body conductive layer and on which a peripheral transistor is located. A bottom surface of the body conductive layer of the second semiconductor chip may face a bottom surface of the body conductive layer of the first semiconductor chip.

20 Claims, 29 Drawing Sheets

(51) Int. Cl.
*H01L 25/065* (2006.01)
*H01L 29/423* (2006.01)
*H01L 29/66* (2006.01)
*H01L 27/11582* (2017.01)
*H01L 27/11575* (2017.01)

(52) U.S. Cl.
CPC .. *H01L 27/11575* (2013.01); *H01L 27/11582* (2013.01); *H01L 29/4234* (2013.01); *H01L 29/66833* (2013.01)

(58) Field of Classification Search
CPC ......... H01L 27/11568; H01L 27/11521; H01L 27/11524; H01L 27/2481; H01L 21/8221; H01L 25/50; H01L 25/0657
See application file for complete search history.

(56) References Cited

U.S. PATENT DOCUMENTS

| | | | |
|---|---|---|---|
| 7,495,337 B2 | 2/2009 | Walker et al. |
| 7,629,233 B2 | 12/2009 | Bernstein et al. |
| 7,683,404 B2 | 3/2010 | Jang et al. |
| 7,781,807 B2 | 8/2010 | Nishihara et al. |
| 8,232,599 B2 | 7/2012 | Chou et al. |
| 8,299,583 B2 | 10/2012 | Zhu |
| 8,552,568 B2 | 10/2013 | Sinha et al. |
| 8,654,584 B2 | 2/2014 | Kim et al. |
| 8,759,899 B1 | 6/2014 | Lue et al. |
| 8,803,206 B1 | 8/2014 | Or-Bach et al. |
| 9,130,052 B2 | 9/2015 | Kim et al. |
| 9,184,096 B2 | 11/2015 | Lee et al. |
| 9,190,472 B2 | 11/2015 | Tessariol et al. |
| 9,236,426 B2 | 1/2016 | Lee |
| 9,257,508 B2 | 2/2016 | Lee et al. |
| 9,293,172 B2 | 3/2016 | Lee et al. |
| 9,305,934 B1 | 4/2016 | Ding et al. |
| 9,337,198 B2 | 5/2016 | Kwon et al. |
| 9,343,479 B2 | 5/2016 | Tanzawa |
| 9,356,043 B1 | 5/2016 | Sakakibara et al. |
| 9,450,181 B2 | 9/2016 | Kiyotoshi et al. |
| 9,461,019 B2 | 10/2016 | Miyajima |
| 9,502,432 B1 | 11/2016 | Shin |
| 9,502,471 B1 | 11/2016 | Lu et al. |
| 9,543,318 B1 | 1/2017 | Lu et al. |
| 9,601,577 B1 | 3/2017 | Lee et al. |
| 9,691,781 B1 | 6/2017 | Nishikawa et al. |
| 9,953,925 B2 | 4/2018 | Or-Bach et al. |
| 2006/0216886 A1 | 9/2006 | Jang et al. |
| 2008/0067573 A1 | 3/2008 | Jang et al. |
| 2008/0073635 A1 | 3/2008 | Kiyotoshi et al. |
| 2009/0230449 A1 | 9/2009 | Sakaguchi et al. |
| 2010/0109071 A1 | 5/2010 | Tanaka et al. |
| 2011/0241101 A1 | 10/2011 | Ino et al. |
| 2012/0108048 A1 | 5/2012 | Lim et al. |
| 2012/0168831 A1 | 7/2012 | Ahn |
| 2012/0168858 A1 | 7/2012 | Hong |
| 2012/0181602 A1* | 7/2012 | Fukuzumi ......... H01L 27/11578 257/326 |
| 2013/0065386 A1 | 3/2013 | Kim et al. |
| 2013/0320424 A1 | 12/2013 | Lee et al. |
| 2014/0061776 A1 | 3/2014 | Kwon et al. |
| 2014/0061849 A1 | 3/2014 | Tanzawa |
| 2014/0252426 A1 | 9/2014 | Huang et al. |
| 2015/0079748 A1 | 3/2015 | Kim et al. |
| 2015/0179660 A1 | 6/2015 | Yada et al. |
| 2015/0221667 A1 | 8/2015 | Fukuzumi et al. |
| 2015/0303214 A1 | 10/2015 | Kim et al. |
| 2016/0064041 A1 | 3/2016 | Okada et al. |
| 2016/0079164 A1 | 3/2016 | Fukuzumi et al. |
| 2016/0111436 A1 | 4/2016 | Ding et al. |
| 2016/0133630 A1 | 5/2016 | Kim et al. |
| 2016/0149004 A1 | 5/2016 | Rabkin et al. |
| 2016/0329101 A1 | 11/2016 | Sakakibara |
| 2016/0365356 A1 | 12/2016 | Jung et al. |
| 2017/0047403 A1 | 2/2017 | Oda |
| 2017/0062461 A1 | 3/2017 | Takamatsu |
| 2017/0104068 A1 | 4/2017 | Lee et al. |
| 2017/0194057 A1 | 7/2017 | Lee et al. |

FOREIGN PATENT DOCUMENTS

| | | |
|---|---|---|
| JP | 2011-204829 A | 10/2011 |
| KR | 2008-0027162 A | 3/2008 |
| KR | 2010-0109745 A | 10/2010 |
| KR | 101040154 B1 | 6/2011 |
| KR | 10-2012-0003351 A | 1/2012 |
| KR | 2013-0072516 A | 7/2013 |
| KR | 10-2013-0136249 A | 12/2013 |

OTHER PUBLICATIONS

U.S. Office Action dated Feb. 15, 2019 in corresponding U.S. Appl. No. 15/841,762.
U.S. Office Action dated May 6, 2019, issued in co-pending U.S. Appl. No. 15/841,762.
Notice of Allowance dated Apr. 22, 2019, issued in co-pending U.S. Appl. No. 15/989,477.
Advisory Action dated Jul. 30, 2019, issued in co-pending U.S. Appl. No. 15/841,762.

* cited by examiner

SEMICONDUCTOR MEMORY DEVICES AND METHODS OF FABRICATING THE SAME

CROSS-REFERENCE TO RELATED APPLICATIONS

This U.S. non-provisional patent application is a divisional of U.S. application Ser. No. 15/982,001, filed May 17, 2018, and claims priority under 35 U.S.C. § 119 to Korean Patent Application No. 10-2017-0073390, filed on Jun. 12, 2017 and No. 10-2017-0146813, filed on Nov. 6, 2017, in the Korean Intellectual Property Office, the entire contents of each of which are hereby incorporated by reference.

BACKGROUND

The present disclosure relates to semiconductor devices and methods of fabricating the same, and in particular, to three-dimensional nonvolatile memory devices and methods of fabricating the same.

Higher integration of semiconductor devices is desirable to satisfy consumer demands for superior performance and inexpensive prices. In the case of semiconductor memory devices, since integration is an important factor in determining product prices, increased integration is especially desirable. In the case of conventional two-dimensional or planar semiconductor memory devices, since their integration is mainly determined by the area occupied by a unit memory cell, integration is greatly influenced by the level ("maturity") of fine pattern forming technologies and techniques. However, the process equipment needed to increase pattern fineness may be extremely expensive. As a result, capital expenditures associated with such process equipment for increased integration may set a practical limitation on increasing integration for two-dimensional or planar semiconductor memory devices.

SUMMARY

Some example embodiments of the inventive concepts provide a method capable of simplifying a fabrication process of a semiconductor memory device and or improving reliability of a semiconductor memory device.

Some example embodiments of the inventive concepts provide a semiconductor memory device with a reduced thickness.

According to some example embodiments of the inventive concepts, a semiconductor memory device may include a first semiconductor chip and a second semiconductor chip. Each semiconductor chip of the first semiconductor chip and the second semiconductor chip and second semiconductor chips may include a cell array region and a peripheral circuit region. The cell array region may include an electrode structure including a plurality of electrodes sequentially stacked on a body conductive layer and a plurality of vertical structures extending through the electrode structure and connected to the body conductive layer. The peripheral circuit region may include a residual substrate on the body conductive layer and on which a peripheral transistor is located. A bottom surface of the body conductive layer of the second semiconductor chip may face a bottom surface of the body conductive layer of the first semiconductor chip.

According to some example embodiments of the inventive concepts, a semiconductor memory device may include a first semiconductor chip and a second semiconductor chip. Each semiconductor chip of the first semiconductor chip and the second semiconductor chip may include a cell array region and a peripheral circuit region. The cell array region may include an electrode structure including a plurality of electrodes sequentially stacked on a body conductive layer, and a plurality of vertical structures extending through the electrode structure and connected to the body conductive layer. The peripheral circuit region may include a residual substrate on the body conductive layer. The residual substrate may be thicker than the body conductive layer. A bottom surface of the second semiconductor chip may face a bottom surface of the first semiconductor chip. The body conductive layer of the second semiconductor chip may be electrically connected to the body conductive layer of the first semiconductor chip.

According to some example embodiments of the inventive concepts, a method of fabricating a semiconductor memory device may include preparing a first semiconductor chip and a second semiconductor chip. Each semiconductor chip of the first semiconductor chip and the second semiconductor chip may include a cell array region and a peripheral circuit region. The cell array region may include an electrode structure including a plurality of electrodes sequentially stacked on a body conductive layer and a plurality of vertical structures extending through the electrode structure and connected to the body conductive layer. The peripheral circuit region may include a residual substrate on the body conductive layer and on which a peripheral transistor is located. The method may further include bonding the second semiconductor chip to the first semiconductor chip such that respective bottom surfaces of the body conductive layers of the first and second semiconductor chips face each other.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
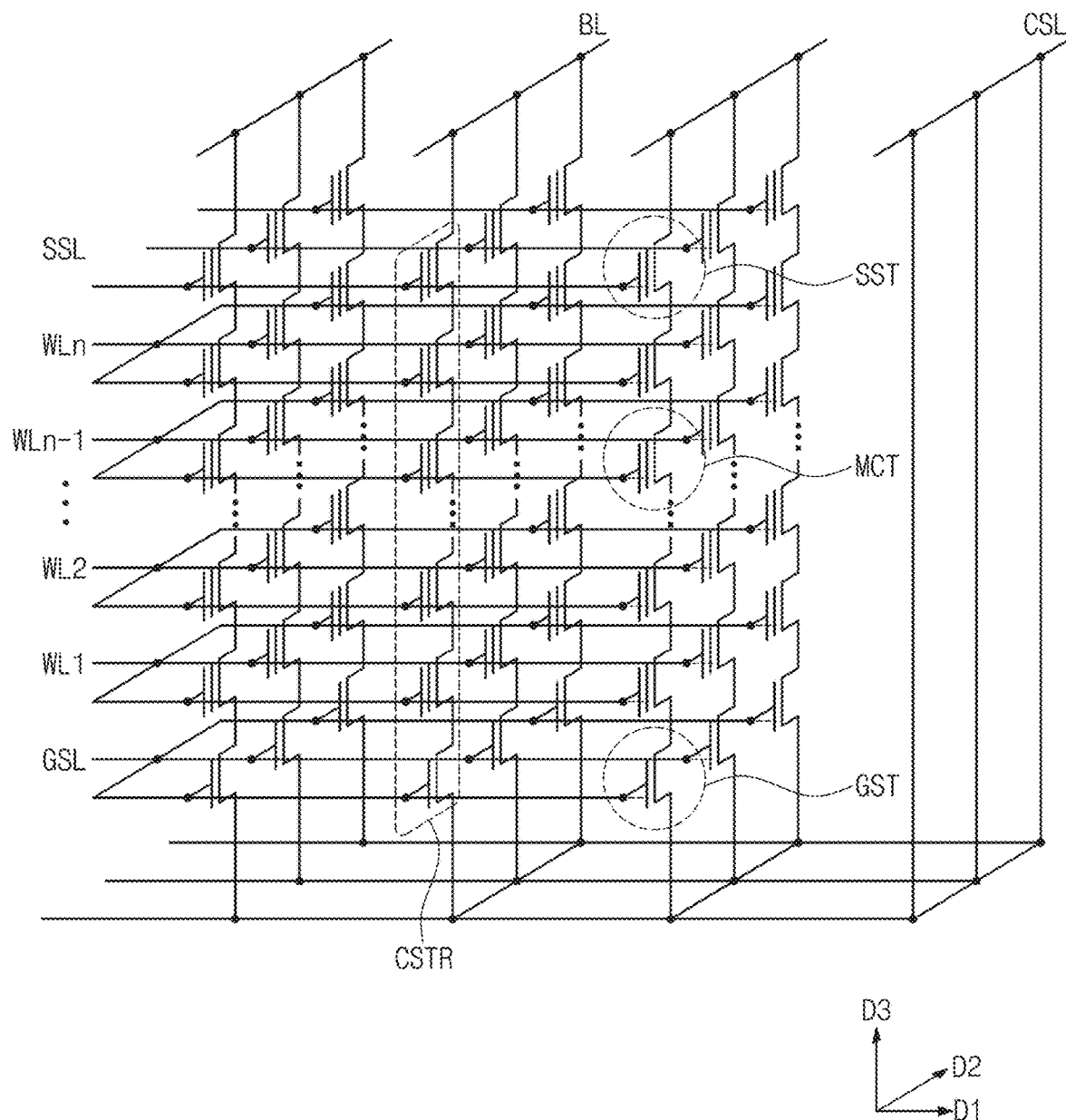
FIG. 1 is a circuit diagram schematically illustrating a cell array region of a semiconductor memory device, according to some example embodiments of the inventive concepts.

FIG. 1 is a circuit diagram schematically illustrating a cell array of a semiconductor memory device, according to some example embodiments of the inventive concepts.

Referring to FIG. 1, a cell array of a semiconductor memory device may include a common source line CSL, a plurality of bit lines BL, and a plurality of cell strings CSTR provided between the common source line CSL and the bit lines BL.

The common source line CSL may be a conductive layer provided on a substrate or an impurity region formed in the substrate. The bit lines BL may be conductive patterns (e.g., metal lines), which are provided on and spaced apart from the substrate. The bit lines BL may be two-dimensionally arranged, and each of the bit lines BL may be connected in parallel to a plurality of the cell strings CSTR. The cell strings CSTR may be connected in common to the common source line CSL. In other words, a plurality of the cell strings CSTR may be provided between the bit lines BL and the common source line CSL. In some example embodiments, a plurality of the common source lines CSL may be provided. Here, the common source lines CSL may be applied with substantially the same voltage. In certain embodiments, electric potentials of the common source lines CSL may be independently controlled.

Each of the cell strings CSTR may include a ground selection transistor GST connected to the common source line CSL, a string selection transistor SST connected to the bit line BL, and a plurality of memory cell transistors MCT provided between the ground and string selection transistors GST and SST. The ground selection transistor GST, the string selection transistor SST, and the memory cell transistors MCT may be connected in series to each other.

The common source line CSL may be connected in common to sources of the ground selection transistors GST. Furthermore, a ground selection line GSL, a plurality of word lines WL1-WLn, and a plurality of string selection lines SSL, which are provided between the common source line CSL and the bit lines BL, may be respectively used gate electrodes of the ground selection transistor GST, the memory cell transistors MCT, and the string selection transistors SST. Furthermore, each of the memory cell transistors MCT may include a data storage element.

Figure 2A:
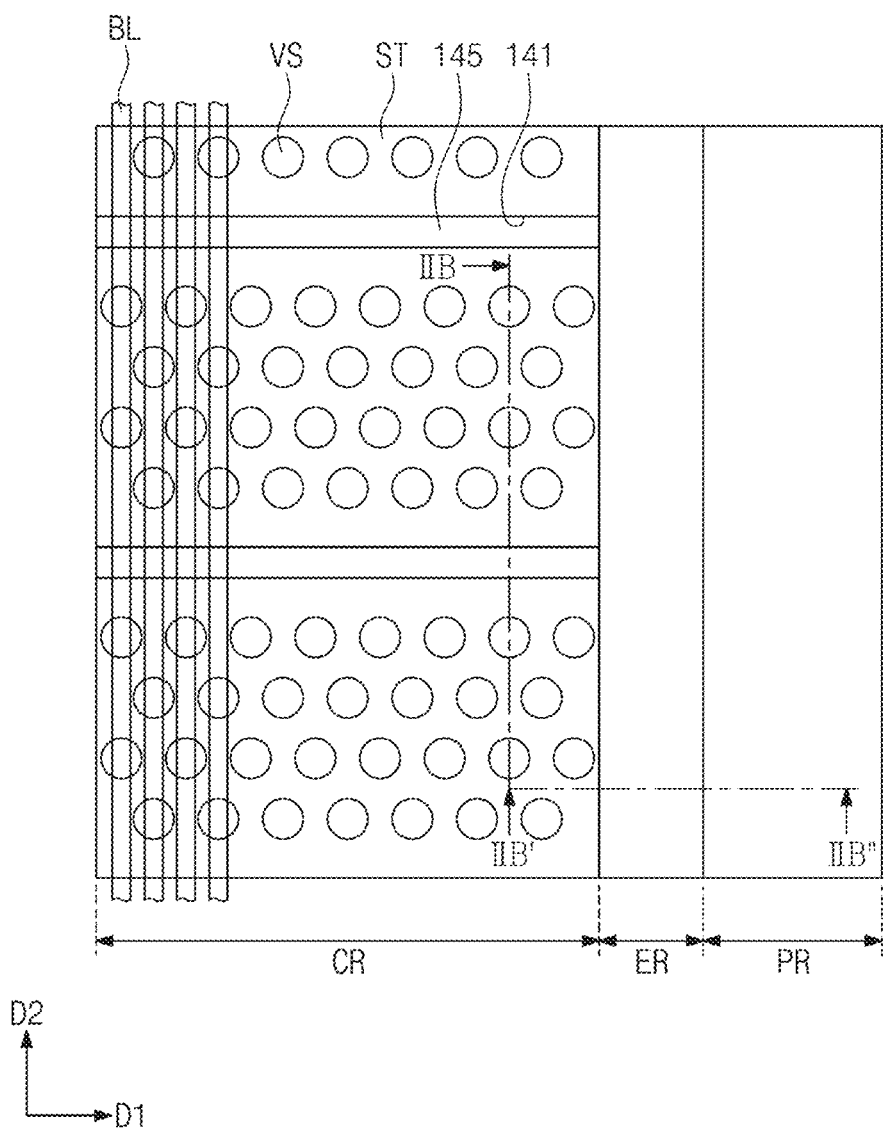
FIG. 2A is a plan view illustrating a semiconductor memory device according to some example embodiments of the inventive concepts.
Figure 2B:
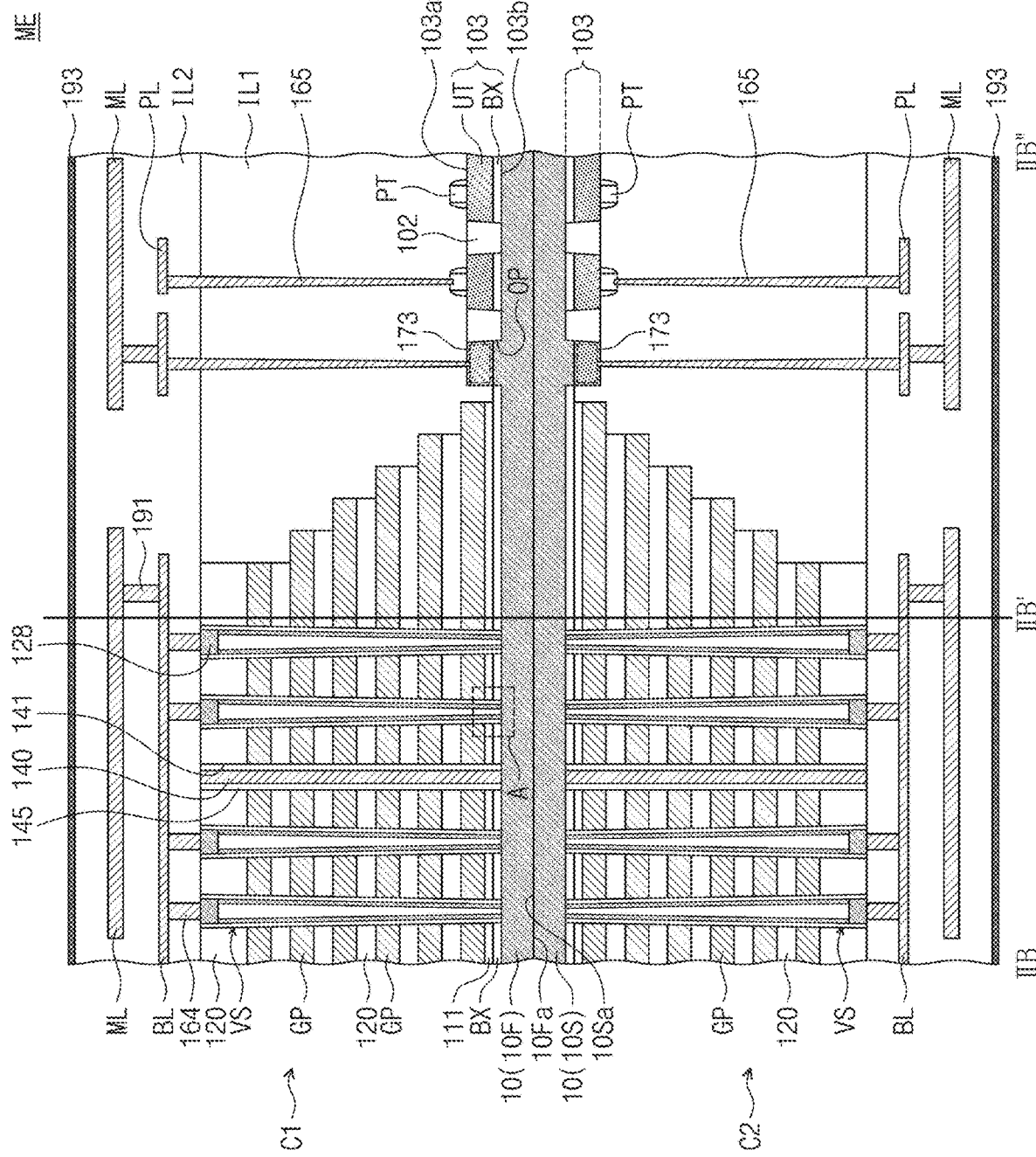
FIG. 2B is a sectional view taken along line IIB-IIB'-IIB" of FIG. 2A.
Figure 3A:
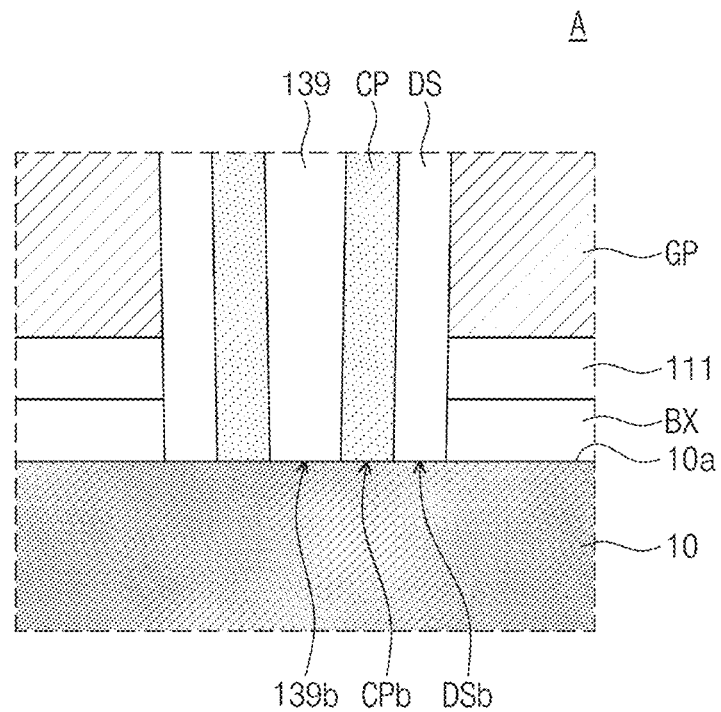
FIGS. 3A and 3B are enlarged views illustrating a region 'A' of FIG. 2B.
Figure 3B:
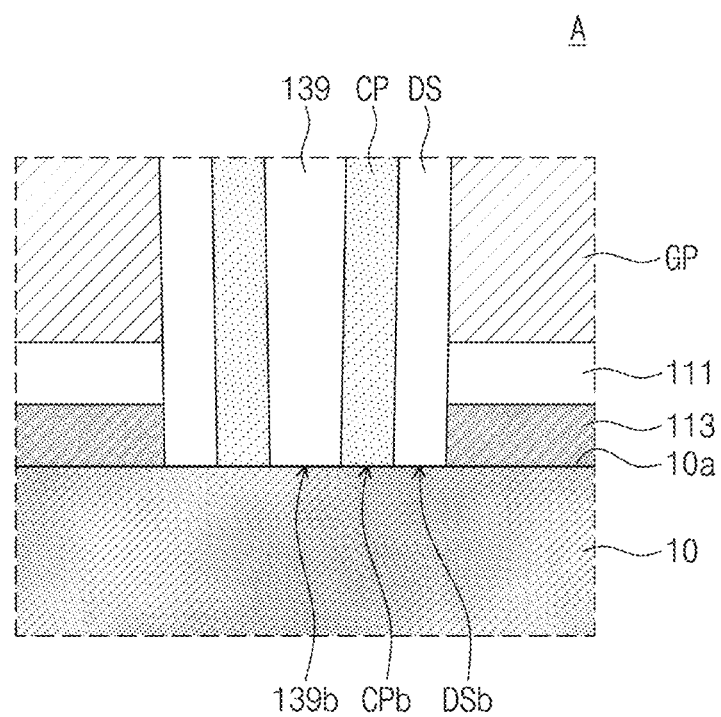

FIG. 2A is a plan view illustrating a semiconductor memory device according to some example embodiments of the inventive concepts. FIG. 2B is a sectional view taken along line IIB-IIB'-IIB" of FIG. 2A. FIGS. 3A and 3B are enlarged views illustrating a region 'A' of FIG. 2B.

Referring to FIGS. 2A and 2B and FIGS. 3A and 3B, a semiconductor memory device ME including a first semiconductor chip C1 and a second semiconductor chip C2 may be provided. The first semiconductor chip C1 may be a memory chip that is substantially the same as or similar to the second semiconductor chip C2. Hereinafter, the first and second semiconductor chips C1 and C2 will be described with reference to the first semiconductor chip C1.

The first semiconductor chip C1 may include a cell array region CR, a connection region ER, and a peripheral circuit region PR. As an example, the first semiconductor chip C1 may be a FLASH memory chip. The cell array region CR may be a region, on which a plurality of memory cells are provided, and in some example embodiments, the cell array of FIG. 1 may be provided on the cell array region CR.

The peripheral circuit region PR may be a region, on which a word line driver, a sense amplifier, row and column decoders, and control circuits are provided. For convenience in illustration, the peripheral circuit region PR is illustrated to be located in one of side regions of the cell array region CR, but in certain embodiments, the peripheral circuit region PR may further include a portion that is located in at least one of other side regions of the cell array region CR. As an example, the peripheral circuit region PR may be provided to enclose the cell array region CR.

The connection region ER may be a region, on which connection pads are provided. Here, the connection pads may be end portions of the gate electrodes to be described below and may be formed to have a stepwise shape, allowing for the electric connection to the gate electrodes.

A residual substrate 103 may be provided on the peripheral circuit region PR, and peripheral transistors PT may be provided ("located") on the residual substrate 103. Each of the peripheral transistors PT may include a gate electrode and a gate insulating layer. The peripheral transistors PT may include PMOS transistors and/or NMOS transistors.

The residual substrate 103 may include a buried insulating layer BX and a peripheral active layer UT on the buried insulating layer BX. In some example embodiments, the residual substrate 103 may be a part of a semiconductor-on-insulator substrate. For example, the residual substrate 103 may be a silicon-on-insulator (SOI) substrate, from which a lower semiconductor layer is removed. The residual substrate 103 may include a device isolation layer 102, which is provided to penetrate the buried insulating layer BX and the peripheral active layer UT. In certain embodiments, the residual substrate 103 may be a silicon substrate, in which an insulating layer is not included. Hereinafter, the description that follows will refer to an example in which the SOI substrate is used as the residual substrate 103, but the inventive concepts are not limited thereto.

The residual substrate 103 may have a top surface 103a, on which gate electrodes are provided, and a bottom surface 103b, which is an opposite surface of the top surface 103a. As an example, a distance between the top and bottom surfaces 103a and 103b of the residual substrate 103 (i.e., a thickness of the residual substrate 103) may range from about 50 nm to 1000 μm.

The peripheral active layer UT may be a silicon layer having a substantially single-crystalline structure. In the present specification, the term "substantially single-crystalline structure" may be used to refer to a crystalline structure that is formed to have the same orientation without an internal grain boundary. Furthermore, it may also be used to refer to a crystalline object that includes at least one localized small portion having a grain boundary or a different orientation but is mostly formed to have the single crystalline structure. For example, a layer having a single-crystalline structure may include a plurality of low-angle grain boundaries, in practice.

The peripheral active layer UT may be a region, in which source, drain, and channel regions of the peripheral transistor PT are formed. As an example, the peripheral active layer UT may include region and drain regions doped to have a p- or n-type conductivity, depending on the type of the peripheral transistor PT.

A portion of the residual substrate 103 (e.g., at least a portion of the buried insulating layer BX) may extend from the peripheral circuit region PR to the cell array region CR. In certain embodiments, the residual substrate 103 may be locally provided in the peripheral circuit region PR.

According to some example embodiments of the inventive concepts, the peripheral circuit region PR may include a body conductive layer 10 provided below the residual substrate 103. Thus, the residual substrate 103 may be on the body conductive layer 10. The body conductive layer 10 may be in contact with the bottom surface 103b of the residual substrate 103, but the inventive concepts are not limited thereto. The body conductive layer 10 may include a semiconductor material and/or a metal material. For example, the body conductive layer 10 may include a polycrystalline semiconductor layer (e.g., a poly silicon layer). The body conductive layer 10 may not be limited to the silicon layer, and in certain embodiments, the body conductive layer 10 may be or include at least one of a germanium layer or a silicon-germanium layer. The body conductive layer 10 may be provided not only in the peripheral circuit region PR but also in the cell array region CR. The body conductive layer 10 may have a first conductivity type (e.g., p-type).

The residual substrate 103 may include a pick-up impurity region 173 that is electrically connected to the body conductive layer 10. The pick-up impurity region 173 may have the same conductivity type (e.g., a common conductivity type) as the body conductive layer 10. For example, the pick-up impurity region 173 may be of the first conductivity type. The residual substrate 103 may include an opening OP formed below the pick-up impurity region 173. Restated, the opening OP may be vertically overlapping with the pick-up impurity region 173. As an example, the opening OP may be a region which is formed by removing a portion of the buried insulating layer BX of the residual substrate 103. As shown in at least FIG. 2B, the body conductive layer 10 may include a protruding portion extending into the opening OP. The body conductive layer 10 may be connected to the pick-up impurity region 173 via the protruding portion.

Interlayered insulating layers IL1 and IL2 may be provided to cover the peripheral transistors PT. As an example, the interlayered insulating layers IL1 and IL2 may be formed of or include at least one of a silicon oxide layer and/or a silicon oxynitride layer. Peripheral contacts 165 may be provided to penetrate the interlayered insulating layers IL1 and IL2 and may be connected to the peripheral transistors PT. Peripheral lines PL, which are connected to the peripheral contacts 165, may be provided in the upper interlayered insulating layer IL2. The peripheral contact 165 and the peripheral line PL may be formed of or include at least one of conductive materials (e.g., doped silicon, metals, and conductive metal nitrides).

The cell array region CR may include a plurality of electrode structures ST, each of which includes gate electrodes GP sequentially stacked on the body conductive layer 10. Insulating layers 120 may be provided between the gate electrodes GP. For example, the gate electrodes GP and the insulating layers 120 may be alternately and repeatedly stacked on the body conductive layer 10. A buffer layer 111 may be provided between the lowermost one of the gate electrodes GP and the body conductive layer 10. In some example embodiments, the insulating layers 120 and the buffer layer 111 may be formed of or include at least one of a silicon oxide layer and/or a silicon oxynitride layer. The buffer layer 111 may be thinner than each of the insulating layers 120.

As an example, the lowermost one of the gate electrodes GP may be a portion of the gate electrode of the ground selection transistor (e.g., a portion of the ground selection line GSL of FIG. 1), and the uppermost one of the gate electrodes GP may be a portion of the gate electrode of the string selection transistor (e.g., a portion of the string selection line SSL of FIG. 1). Each of other gate electrodes of the gate electrodes GP between the lowermost and uppermost electrodes may be a portion of a cell gate electrode (e.g., a portion of one of the word lines WL1-WLn of FIG. 1). Although six gate electrodes are illustrated, the number of the gate electrodes constituting each electrode structure ST may be greater or smaller than six.

Each of the gate electrodes GP in the electrode structures ST may extend in a first direction D1. The electrode structures ST may be spaced apart from each other in a second direction D2, with separation patterns 145 interposed therebetween. For example, separation trenches 141 may be provided between the electrode structures ST, and the separation patterns 145 may be provided in the separation trenches 141. Each of the separation patterns 145 may extend in the first direction D1. As an example, the separation patterns 145 may be formed of or include at least one of a silicon oxide layer, a silicon nitride layer, or a silicon oxynitride layer.

A thickness of the body conductive layer 10 may be less than that of the residual substrate 103. As an example, the thickness of the body conductive layer 10 may be about 0.1 to about 0.9 times the thickness of the residual substrate 103. Restated, the body conductive layer 10 of each semiconductor chip may be thinner than the residual substrate 103 of the semiconductor chip in a direction extending perpendicular to a bottom surface of the semiconductor chip. For example, the first body conductive layer 10F may be thinner than the residual substrate 103 of the first semiconductor chip C1 in a direction extending perpendicular to the bottom surface 10Fa of the first semiconductor chip C1, and the second body conductive layer 10S may be thinner than the residual substrate 103 of the second semiconductor chip C2 in a direction extending perpendicular to the bottom surface 10Sa of the second semiconductor chip C2. Restated further, the residual substrate 103 of a given semiconductor chip, of the first and second semiconductor chips C1 and C2, may be thicker than the body conductive layer 10 of the given semiconductor chip.

Common source lines 140 may be provided to penetrate the separation patterns 145 and may be connected to the body conductive layer 10. As shown in at least FIG. 2B, a common source line 140 may be between adjacent electrode structures ST of a plurality of electrode structures ST and may be connected to the body conductive layer 10. In some example embodiments, each of the common source lines 140 may be a plate-shape structure extending in the first direction D1. In certain embodiments, each of the common source lines 140 may include a plurality of contact plugs, which are provided to penetrate each of the separation patterns 145.

The common source lines 140 may be formed of or include at least one of doped silicon, metals, or conductive metal nitrides. For example, in the case where the common source lines 140 include doped silicon, the common source lines 140 may be provided to have a different conductivity type (e.g., a second conductivity type) from that of the body conductive layer 10. For example, the second conductivity type may be an n-type. In the case where the common source lines 140 include a metal material (e.g., tungsten, titanium, tantalum, and nitrides thereof), a metal silicide layer (e.g., a tungsten silicide layer) may be further provided between the common source lines 140 and the body conductive layer 10.

A plurality of vertical structures VS may be provided to penetrate ("extend through") the electrode structures ST and may be connected to the body conductive layer 10. Each of the vertical structures VS may be shaped like a circular pillar having a decreasing width in a downward direction. The vertical structures VS may be two-dimensionally arranged on the body conductive layer 10. In the present specification, the expression "elements are two-dimensionally arranged" will be used to represent that, when viewed in a plan view, the elements are arranged in two orthogonal directions (e.g., in the first and second directions D1 and D2) to form a plurality of columns and a plurality of rows. For example, each column of the vertical structures VS may include a plurality of the vertical structures VS arranged in the first direction D1, and the vertical structures VS may be arranged to form a plurality of columns in each of the electrode structures ST. As an example, four columns of the vertical structures VS may be provided to penetrate one electrode structure ST, as shown in FIG. 2A, but the inventive concepts is not limited thereto. For example, the number of the columns provided in each of the electrode structures ST may be larger than or smaller than four. In some example embodiments, the vertical structures VS constituting odd-numbered columns may be offset from the vertical structures VS constituting even-numbered columns, in the first direction D1.

As shown in FIGS. 3A and 3B, each of the vertical structures VS may include a buried insulating layer 139, a channel semiconductor layer CP, and a data storing layer DS. As an example, the buried insulating layer 139 may be shaped like a circular pillar, and the channel semiconductor layer CP and the data storing layer DS may be sequentially provided on the buried insulating layer 139. In certain embodiments, the buried insulating layer 139 may not be provided. As an example, the buried insulating layer 139 may include a silicon oxide layer. The channel semiconductor layer CP may be formed of or include a polycrystalline semiconductor material. The channel semiconductor layer CP may be in an undoped or intrinsic state or may be lightly doped to have the first or second conductivity type. As an example, the channel semiconductor layer CP may include a poly silicon layer. In certain embodiments, the channel semiconductor layer CP may include germanium or silicon-germanium. In certain embodiments, a conductive layer (e.g., metals, conductive metal nitrides, silicides), or a nano structure (e.g., carbon nanotube or graphene) may be provided, instead of the channel semiconductor layer CP. The channel semiconductor layer CP may be shaped like an open-bottom pipe.

The data storing layer DS may include a blocking insulating layer adjacent to the gate electrodes GP, a tunnel insulating layer adjacent to the channel semiconductor layer CP, and a charge storing layer therebetween. The blocking insulating layer may be formed of or include at least one of high-k dielectric materials (e.g., aluminum oxide or hafnium oxide). The blocking insulating layer may be a multi-layered structure including a plurality of thin layers. For example, the blocking insulating layer may include a first blocking insulating layer and a second blocking insulating layer, and here, each of the first and second blocking insulating layers may be formed of or include aluminum oxide and/or hafnium oxide. All of the first and second blocking insulating layers may extend along the channel semiconductor layer CP or in a vertical direction, but in certain embodiments, a portion of the first blocking insulating layer may extend into regions between the gate electrodes GP and the insulating layers 120.

The charge storing layer may be a charge trap layer or an insulating layer with conductive nano particles. The charge trap layer may include, for example, a silicon nitride layer. The tunnel insulating layer may include a silicon oxide layer and/or a high-k dielectric layer (e.g., hafnium oxide or aluminum oxide). The charge storing layer and the tunnel insulating layer may extend along the channel semiconductor layer CP or in the vertical direction.

As shown in FIGS. 3A and 3B, a bottom surface DSb of the data storing layer DS, a bottom surface CPb of the channel semiconductor layer CP, and a bottom surface 139b of the buried insulating layer 139 may be located at substantially the same level and/or may be coplanar with each other. As an example, the bottom surface DSb of the data storing layer DS, the bottom surface CPb of the channel semiconductor layer CP, and the bottom surface 139b of the buried insulating layer 139 may be in contact with a top surface 10a of the body conductive layer 10. In certain embodiments, according to a planarization process to be described below, there may be a height difference between the bottom surface DSb of the data storing layer DS, the bottom surface CPb of the channel semiconductor layer CP, and the bottom surface 139b of the buried insulating layer 139.

The bottom surface CPb of the channel semiconductor layer CP may be in direct contact with the top surface 10a of the body conductive layer 10. In some example embodiments, there may be an interfacial surface between the channel semiconductor layer CP and the body conductive layer 10, but the inventive concepts are not limited thereto. As shown in FIG. 3A, the buried insulating layer BX may be provided between the buffer layer 111 and the body conductive layer 10. The vertical structures VS may be provided to penetrate the buffer layer 111 and the buried insulating layer BX and may be connected to the body conductive layer 10. In certain embodiments, the buffer layer 111 may be in contact with the lowermost one of the gate electrodes GP. The buried insulating layer BX may extend from the peripheral circuit region PR to the cell array region CR (e.g., extends between the peripheral circuit region PR and the cell array region CR).

As shown in FIG. 3B, an etch stop layer 113 may be provided between the buffer layer 111 and the body conductive layer 10. A bottom surface of the etch stop layer 113 may be in contact with the top surface 10a of the body conductive layer 10 and may be located at the same level as the bottom surface DSb of the data storing layer DS, the bottom surface CPb of the channel semiconductor layer CP, and the bottom surface 139b of the buried insulating layer 139. As an example, the etch stop layer 113 may be formed of or include at least one of metal oxides (e.g., aluminum oxide).

The vertical structures VS may include pad patterns 128 provided in top portions thereof. The pad patterns 128 may be formed of or include at least one of doped poly silicon or metals. A side surface of each of the pad patterns 128 may be in contact with an inner side surface of the data storing layer DS.

The bit lines BL may be provided on the vertical structures VS. Each of the bit lines BL may be connected in common to a plurality of the vertical structures VS. For convenience in illustration, some of the bit lines BL are illustrated in FIG. 2A. The bit lines BL may be electrically connected to the vertical structures VS through bit line contacts 164. The method of connecting the bit lines BL to the vertical structures VS is not limited to that illustrated in FIG. 2A and may be variously changed. As an example, sub-bit lines may be provided between the bit lines BL and the bit line contacts 164. The bit lines BL and the bit line contacts 164 may be formed of or include at least one of metals (e.g., tungsten, copper, or aluminum), conductive metal nitrides (e.g., titanium nitride or tantalum nitride), or transition metals (e.g., titanium or tantalum).

Upper interconnection lines ML may be provided on the bit lines BL and the peripheral line PL. The upper interconnection lines ML may be connected to the bit lines BL or the peripheral line PL through upper contacts 191. The upper interconnection lines ML and the upper contacts 191 may be formed of or include at least one of metals or conductive metal nitrides.

A protection layer 193 may be provided on the upper interconnection lines ML. The protection layer 193 may be provided to cover the upper interlayered insulating layer IL2. In some example embodiments, the protection layer 193 may be formed of or include silicon nitride or silicon oxynitride. In certain embodiments, although not shown, an opening may be provided to penetrate the protection layer 193 and to expose the upper interconnection lines ML.

As shown in at least FIG. 2B, the bottom surface of the second semiconductor chip C2 may be bonded (e.g., "fixed") to a bottom surface of the first semiconductor chip C1.

A bottom surface 10Fa of a body conductive layer 10F (hereinafter, a first body conductive layer) of the first semiconductor chip C1 may face a bottom surface 10Sa of a body conductive layer 10S (hereinafter, a second body conductive layer) of the second semiconductor chip C2. For example, in the semiconductor memory device ME, the first and second semiconductor chips C1 and C2 may be provided to allow the body conductive layers 10F and 10S to be connected to each other. The first body conductive layer 10F and the second body conductive layer 10S may be electrically connected to each other.

As an example, the bottom surface of the first body conductive layer 10F may be in direct contact with the bottom surface of the second body conductive layer 10S. For example, the first and second semiconductor chips C1 and C2 may be disposed to allow the bottom surface of the first body conductive layer 10F to be in contact with the bottom surface of the second body conductive layer 10S, and then, pressure and heat may be applied to the first and second semiconductor chips C1 and C2 to bond the first semiconductor chip C1 to the second semiconductor chip C2. As an example, a process temperature may be heated to about 300° C. to about 600° C., when the first semiconductor chip C1 is bonded to the second semiconductor chip C2. There may be a crystallographic non-continuous interface between the first body conductive layer 10F and the second body conductive layer 10S. The first and second semiconductor chips C1 and C2 are illustrated to have mirror symmetry with the interface interposed therebetween, but the inventive concepts is not limited thereto. For example, positions of the cell array region and peripheral circuit region CR and PR and shapes and positions of the gate electrodes GP, in each of the first and second semiconductor chips C1 and C2, may be variously changed.

In the semiconductor memory device according to some example embodiments of the inventive concepts, the semiconductor chips C1 and C2 may be connected to each other through the body conductive layers 10. Accordingly, it may be possible to directly and easily connect the semiconductor chips C1 and C2 to each other. As a result, it may be possible to simplify a process of fabricating a semiconductor memory device and to improve reliability of the semiconductor memory device.

Furthermore, in the semiconductor memory device according to some example embodiments of the inventive concepts, the vertical structures VS may be connected to the common source lines 140 through the body conductive layer 10 having a relatively small thickness. Accordingly, it may be possible to reduce a thickness of the semiconductor memory device. This may make it possible to increase the number of gate electrodes provided in the semiconductor memory device and/or the number of the gate stacks including the gate electrodes and consequently to increase an integration density of the semiconductor memory device.

Figure 4:
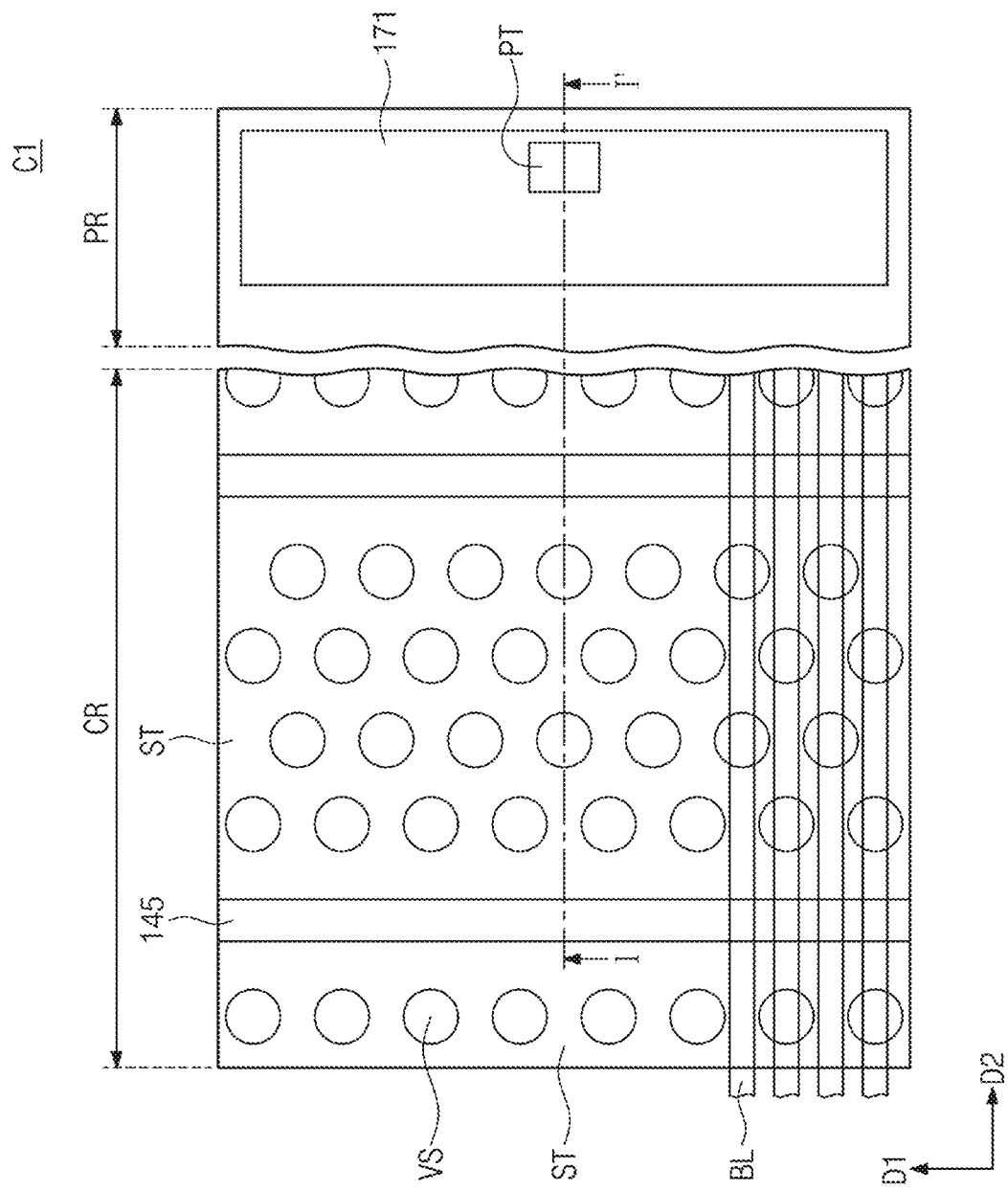
FIG. 4 is a plan view illustrating a first semiconductor chip, according to some example embodiments of the inventive concepts.

FIG. 4 is a plan view illustrating the first semiconductor chip C1, according to some example embodiments of the inventive concepts. FIGS. 5, 6, 7, 8, 9, 10, 11, 12, 13, and 14 are sectional views taken along line I-I' of FIG. 4 to illustrate a method of fabricating the first semiconductor chip C1, according to some example embodiments of the inventive concepts.

Figure 5:
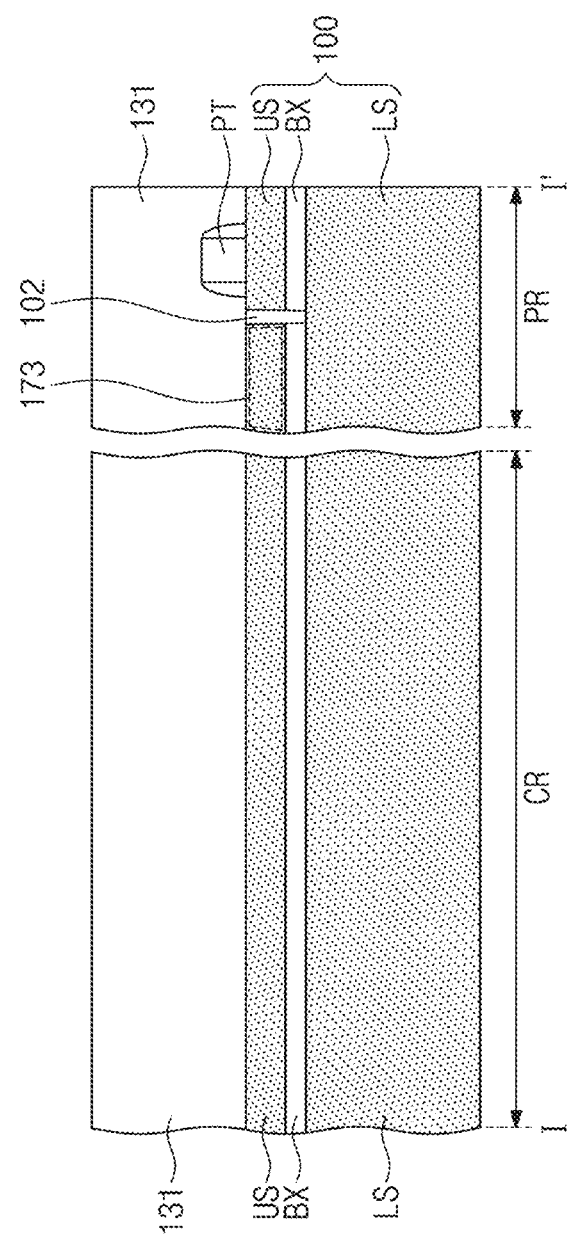
FIGS. 5, 6, 7, 8, 9, 10, 11, 12, 13, and 14 are sectional views taken along line V-V' of FIG. 4 to illustrate a method of fabricating a first semiconductor chip, according to some example embodiments of the inventive concepts.

Referring to FIGS. 4 and 5, a substrate 100 including the cell array region CR and the peripheral circuit region PR may be provided. For convenience in illustration, the connection region ER of FIG. 2A is omitted from FIGS. 4 to 14. The substrate 100 may be a semiconductor-on-insulator substrate. As an example, the substrate 100 may be a silicon-on-insulator (SOI) substrate. The substrate 100 may include a lower semiconductor layer LS, an upper semiconductor layer US, and the buried insulating layer BX therebetween. The lower semiconductor layer LS may be thicker than the buried insulating layer BX. Each of the lower semiconductor layer LS and the upper semiconductor layer US may be substantially a single crystalline layer. Each of the lower semiconductor layer LS and the upper semiconductor layer US may be a semiconductor layer that is doped to have a first conductivity type. The first conductivity type may be a p-type. In certain embodiments, the substrate 100 may be a silicon substrate, in which a buried insulating layer is not included.

The device isolation layer 102 and the peripheral transistors PT may be formed in and on the peripheral circuit region PR. The device isolation layer 102 may be formed to penetrate the upper semiconductor layer US and the buried insulating layer BX. A bottom surface of the device isolation layer 102 is illustrate to be coplanar with a top surface of the lower semiconductor layer LS, but in certain embodiments, the bottom surface of the device isolation layer 102 may be formed at a level spaced apart from the top surface of the lower semiconductor layer LS.

A peripheral impurity region 171 may be formed in the upper semiconductor layer US. The formation of the peripheral transistors PT may include forming gate electrodes on the peripheral impurity region 171. The conductivity type of the peripheral impurity region 171 may be determined depending on the type of the peripheral transistors PT. A bottom surface of the peripheral impurity region 171 may correspond to a bottom surface of the upper semiconductor layer US.

The pick-up impurity region 173 may be formed in the upper semiconductor layer US. The pick-up impurity region 173 may be doped to have the first conductivity type. The pick-up impurity region 173 may be formed by an ion implantation process. After the formation of the peripheral transistors PT, a first interlayered insulating layer 131 may be formed to cover the substrate 100. As an example, the first interlayered insulating layer 131 may be formed of or include a silicon oxide layer.

Figure 6:
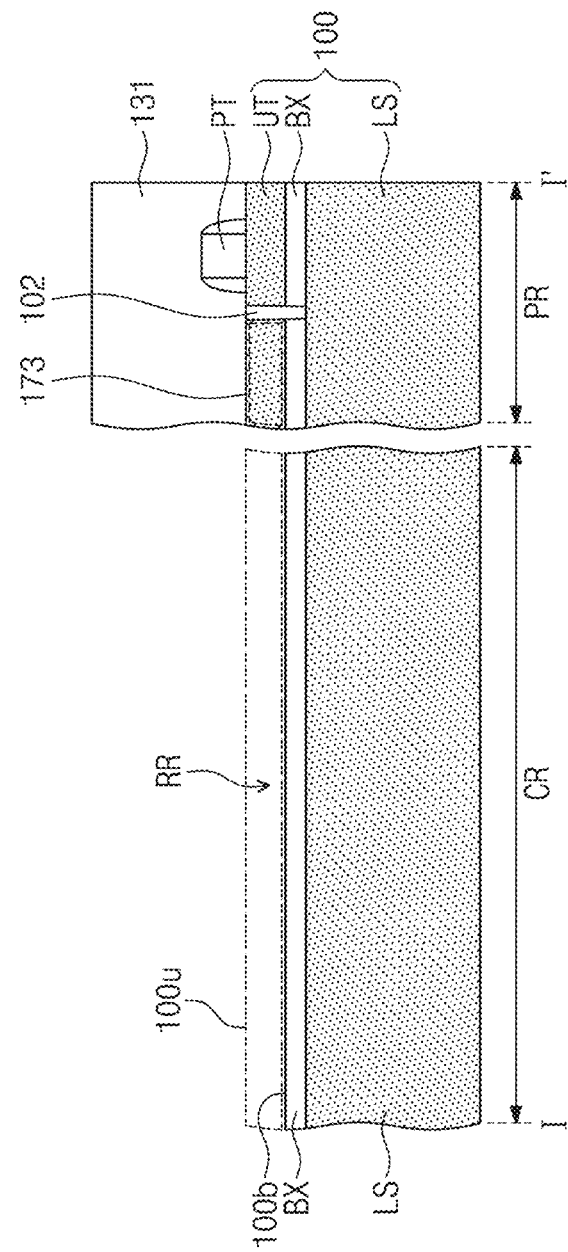

Referring to FIGS. 4 and 6, an upper portion 100u of the substrate 100 may be removed in the cell array region CR, thereby forming a recess region RR. As an example, the upper semiconductor layer US may be removed from the cell array region CR. Accordingly, in the cell array region CR, a top surface 100b of the buried insulating layer BX may be exposed. In certain embodiments, the buried insulating layer BX as well as the upper semiconductor layer US may be removed from the cell array region CR. Hereinafter, a portion of the upper semiconductor layer US remaining in the peripheral circuit region PR will be referred to as the peripheral active layer UT. The formation of the recess region RR may include forming a mask pattern on the substrate 100 to expose the cell array region CR and then etching the first interlayered insulating layer 131 and the substrate 100 using the mask pattern as an etch mask. The etching process may include at least one drying etching process and/or at least one wet etching process.

In some example embodiments, the etch stop layer 113 described with reference to FIG. 3B may be formed on the substrate 100. The etch stop layer 113 may be locally formed in the cell array region CR. The etch stop layer 113 may be formed of at least one of materials which are selected to have an etch selectivity with respect to all of insulating layers 120 and sacrificial layers 125 to be described below. As an example, the etch stop layer 113 may be formed of or include at least one of metal oxides (e.g., aluminum oxide). As another example, the etch stop layer 113 may be omitted. In certain embodiments, the etch stop layer 113 may be formed after the formation of the buffer layer 111 to be described below.

Figure 7:
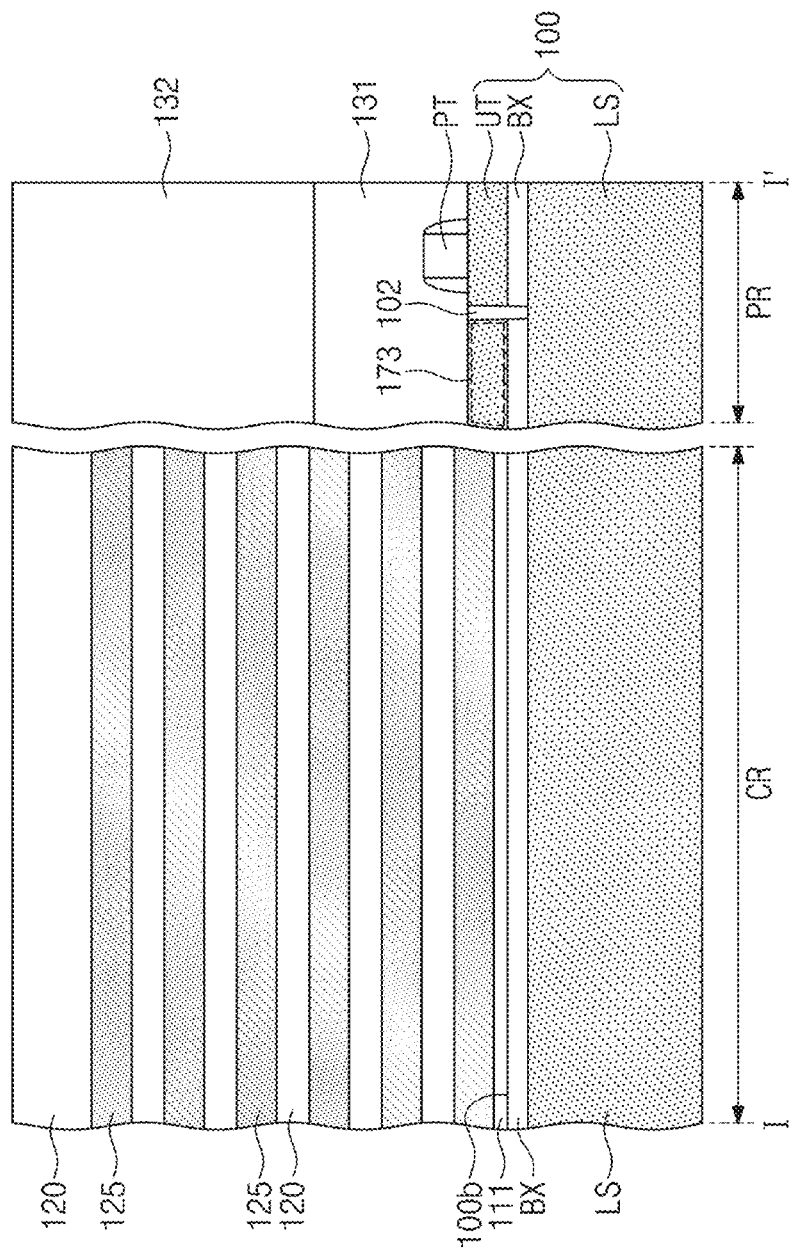

Referring to FIGS. 4 and 7, the buffer layer 111 may be formed on the cell array region CR, and then, the sacrificial layers 125 and the insulating layers 120 may be alternatively and repeatedly formed on the buffer layer 111. The buffer layer 111 may be a silicon oxide layer. As an example, the buffer layer 111 may be formed by a thermal oxidation process. The sacrificial layers 125 and the insulating layers 120 may be formed of different materials, which are selected to have an etch selectivity with respect to each other. For example, a material for the insulating layers 120 may be selected to prevent the insulating layers 120 from being excessively etched in a process for etching the sacrificial layers 125 using a specific etch recipe.

The etch selectivity may be quantitatively expressed by a ratio in etch rate of the insulating layers 120 to the sacrificial layers 125. In some example embodiments, the sacrificial layers 125 may be formed of a material whose etch selectivity with respect to the insulating layers 120 ranges from 1:10 to 1:200 (in particular, from 1:30 to 1:100). As an example, the sacrificial layers 125 may be formed of silicon nitride, silicon oxynitride, or poly silicon, whereas the insulating layers 120 may be formed of silicon oxide. The sacrificial layers 125 and the insulating layers 120 may be formed by a chemical vapor deposition (CVD) process. As shown in FIG. 7, the sacrificial layers 125 and the insulating layers 120 may be removed from the peripheral circuit region PR. Thereafter, a second interlayered insulating layer 132 may be formed to cover the peripheral circuit region PR. As an example, the second interlayered insulating layer 132 may be formed of or include a silicon oxide layer.

Figure 8:
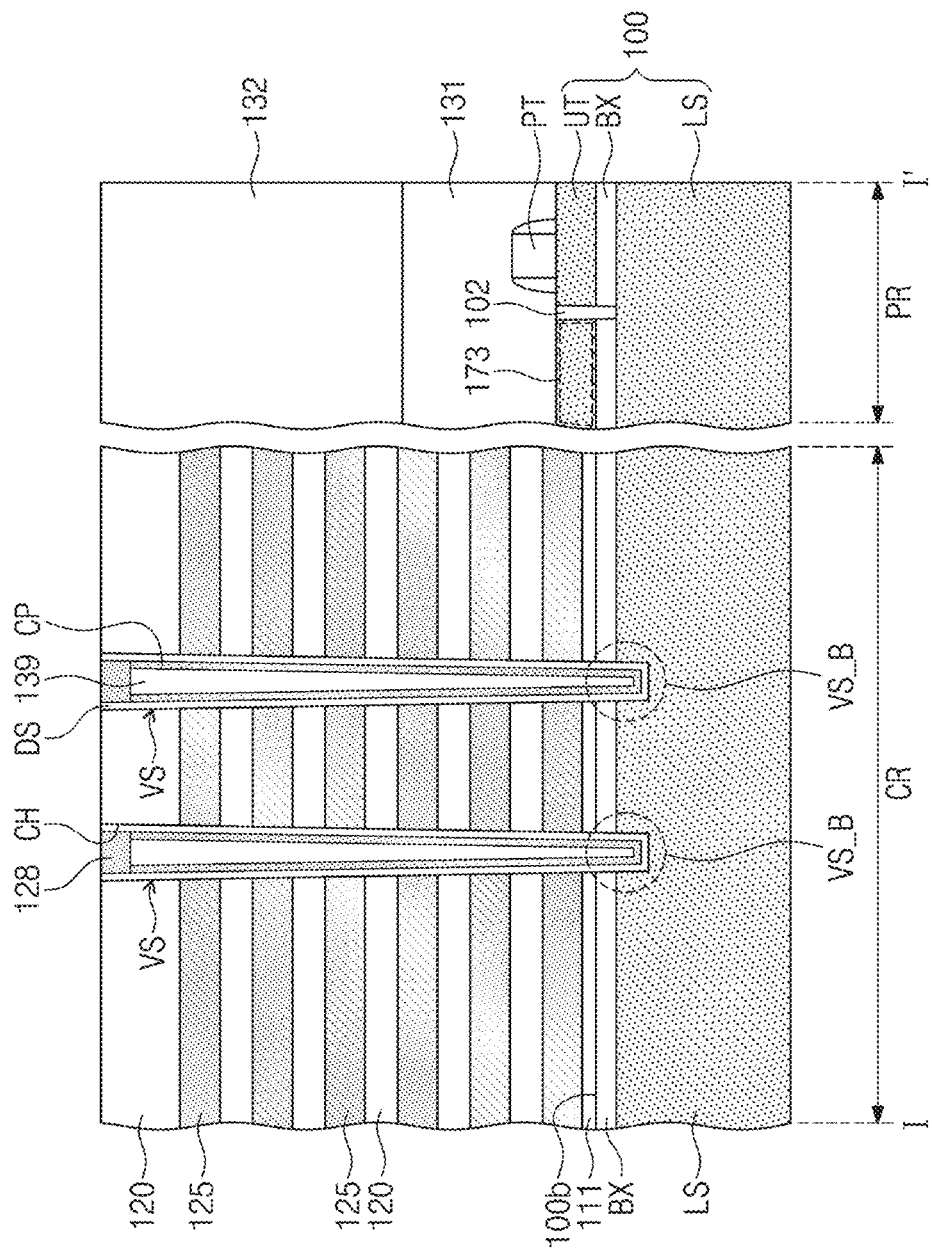

Referring to FIGS. 4 and 8, the vertical structures VS may be formed to penetrate the sacrificial layers 125 and the insulating layers 120 and may be connected to the lower semiconductor layer LS. The formation of the vertical structures VS may include performing an anisotropic etching process to form vertical holes CH penetrating the sacrificial layers 125 and the insulating layers 120 and exposing the substrate 100, and then, sequentially depositing the data storing layer DS, the channel semiconductor layer CP, and the buried insulating layer 139 in the vertical holes CH. The data storing layer DS, the channel semiconductor layer CP, and the buried insulating layer 139 may be formed to have substantially the same features as those of FIGS. 3A and 3B and may be formed by at least one of chemical vapor deposition, atomic layer deposition, and sputtering methods. The data storing layer DS and the channel semiconductor layer CP may be formed to conformally cover side and bottom surfaces of the vertical holes CH. The buried insulating layer 139 may be formed to completely fill the vertical holes CH. Thereafter, the buried insulating layer 139 and the channel semiconductor layer CP may be partially recessed, and then, the pad patterns 128 may be formed to fill the recessed regions. The pad patterns 128 may be formed of or include at least one of doped poly silicon layer or metals.

The vertical structures may be formed to include lower portions VS_B that are inserted into the substrate 100 (e.g., an upper portion of the lower semiconductor layer LS). In other words, the formation of the vertical holes CH may be performed in an over-etching manner, allowing the vertical holes CH to have bottom surfaces lower than the top surface of the lower semiconductor layer LS, and as a result, the lower portions VS_B of the vertical structures may be buried in the lower semiconductor layer LS. In the lower portions VS_B of the vertical structures, the data storing layer DS may be formed to enclose a lower portion of the channel semiconductor layer CP. The channel semiconductor layer CP may be spaced apart from the lower semiconductor layer LS by the data storing layer DS.

Figure 9:
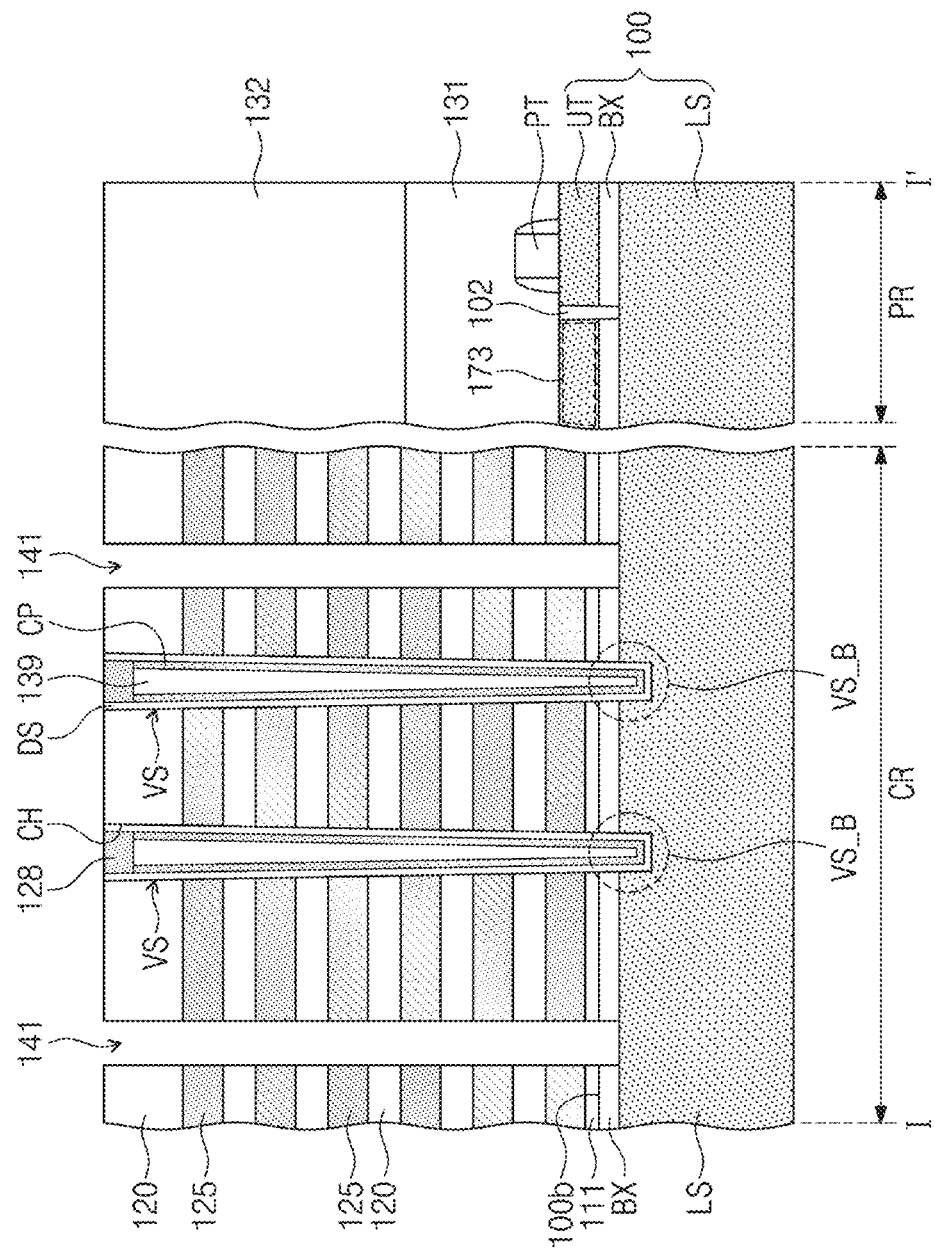

Referring to FIGS. 4 and 9, the separation trenches 141 may be formed to penetrate the sacrificial layers 125 and the insulating layers 120. The separation trenches 141 may be formed to expose the top surface of the lower semiconductor layer LS. The separation trenches 141 may be formed by an anisotropic etching process.

Figure 10:
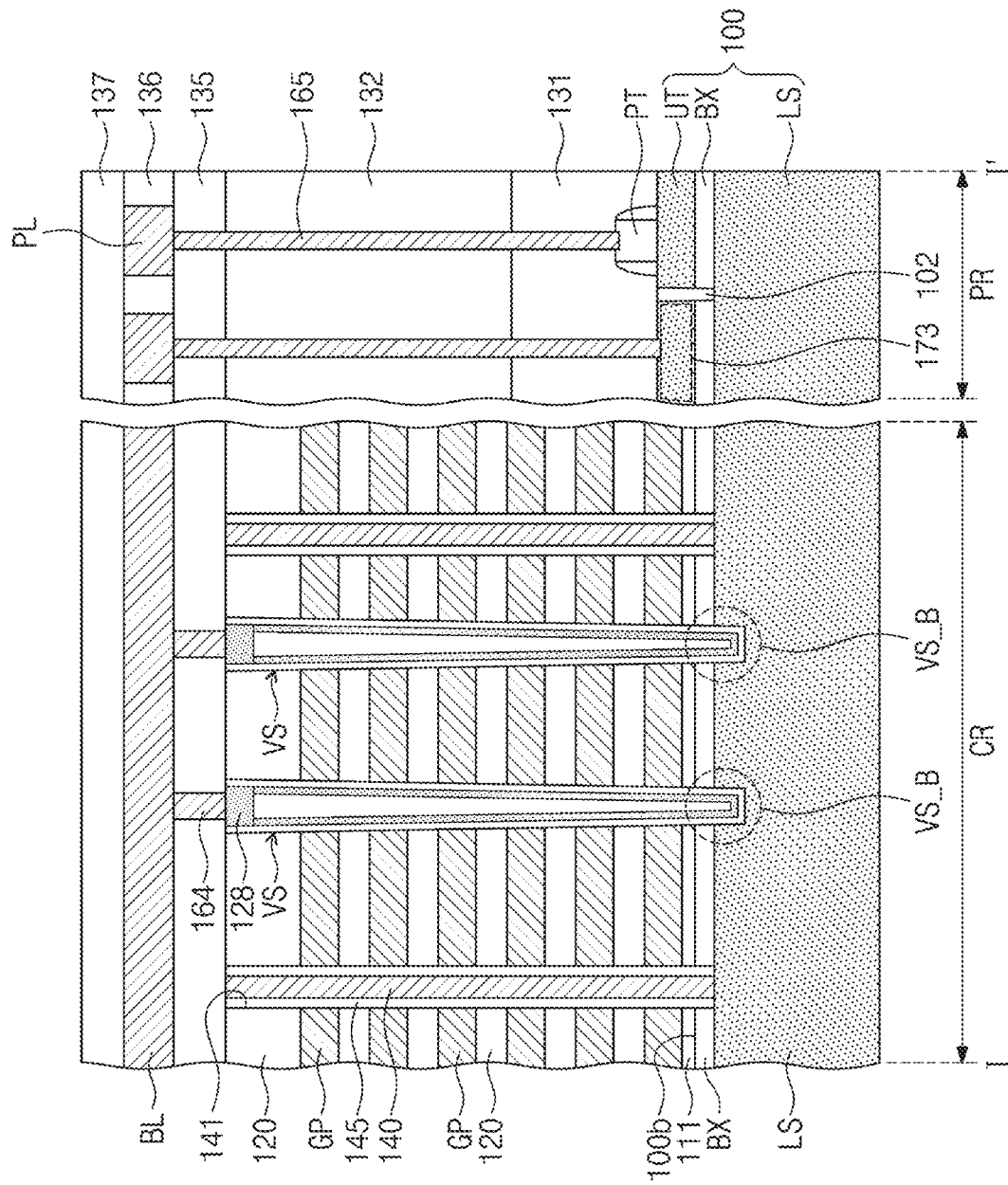

Referring to FIGS. 4 and 10, the sacrificial layers 125 may be replaced with the gate electrodes GP. For example, the sacrificial layers 125 exposed by the separation trenches 141 may be removed, and the gate electrodes GP may be formed in empty regions that are formed by the removal of the sacrificial layers 125. As an example, the removal of the sacrificial layers 125 may be performed using an etching solution, in which phosphoric acid is contained. In some example embodiments, before the formation of the gate electrodes GP, a blocking insulating layer may be formed to conformally cover the empty regions that are formed by the removal of the sacrificial layers 125.

The separation patterns 145 and the common source lines 140 may be formed in the separation trenches 141, and the common source lines 140 may be formed to penetrate the separation patterns 145, thereby being connected to the substrate 100. Each of the common source lines 140 may be a plate-shaped structure extending in the first direction D1. As an example, the separation patterns 145 may be formed to cover side surfaces of the separation trenches 141 or to have a spacer shape, and the common source lines 140 may be formed to fill the separation trenches 141. Alternatively, the formation of the common source lines 140 may include forming contact holes to penetrate the separation patterns 145 and filling the contact holes with a conductive material. The separation patterns 145 may be formed of or include at least one of silicon oxide, silicon nitride, or silicon oxynitride. The common source lines 140 may be formed of or include at least one of doped silicon, metals, or conductive metal nitrides.

In the case where the common source lines 140 include doped silicon, the common source lines 140 may be doped to have a conductivity type (e.g., a second conductivity type) different from that of the lower semiconductor layer LS (e.g., using an in-situ doping method). For example, the second conductivity type may be an n-type.

A third interlayered insulating layer 135 and a fourth interlayered insulating layer 136 may be formed to cover the cell array region CR and the peripheral circuit region PR. The bit line contacts 164 may be formed to penetrate the third interlayered insulating layer 135 and to be connected to the vertical structures VS, and the peripheral contact 165 may be formed to penetrate the first to third interlayered insulating layers 131, 132, and 135 and to be connected to the peripheral transistors PT. At least one of the peripheral contact 165 may be connected to the pick-up impurity region 173. The bit lines BL and the peripheral line PL may be formed in the fourth interlayered insulating layer 136. A fifth interlayered insulating layer 137 may be formed to cover the bit lines BL and the peripheral line PL. The third to fifth interlayered insulating layers 135, 136, and 137 may be formed of or include silicon oxide. The bit lines BL, the peripheral line PL, and the bit line contact 164 and the peripheral contact 165 may be formed of or include (e.g., "may at least partially comprise") at least one of metals (e.g., tungsten, copper, or aluminum), conductive metal nitrides (e.g., titanium nitride or tantalum nitride), or transition metals (e.g., titanium or tantalum).

Figure 11:
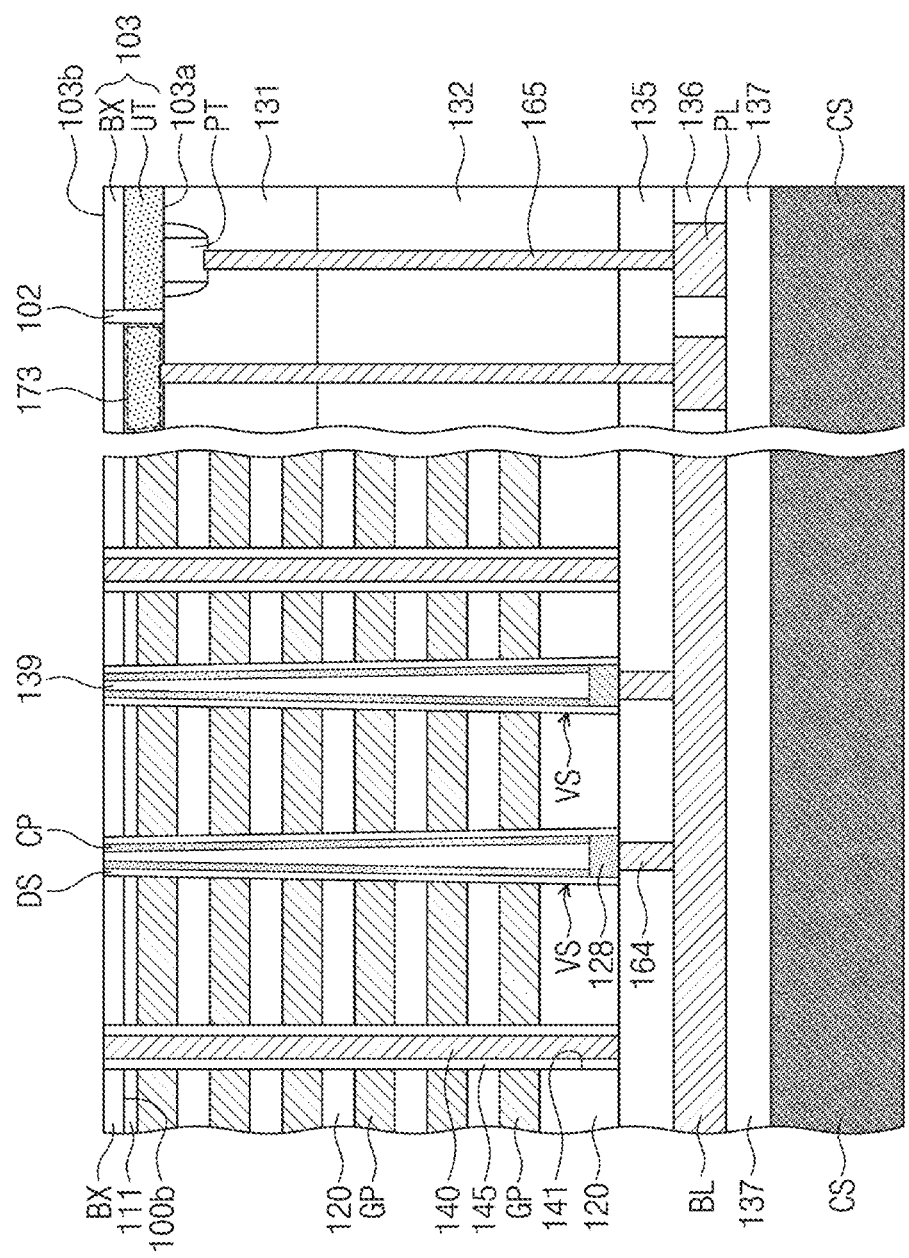

Referring to FIGS. 4 and 11, the lower semiconductor layer LS may be removed. The removal process of the lower semiconductor layer LS may include providing a carrier substrate CS on the fifth interlayered insulating layer 137 and then inverting the structure including the carrier substrate CS to allow the bottom surface of the substrate 100 to be oriented upward. The carrier substrate CS may be an insulating substrate (e.g., a glass substrate) or a conductive substrate (e.g., a metal substrate). As an example, the carrier substrate CS may be bonded to the fifth interlayered insulating layer 137 by an adhesive tape and/or adhesive layer interposed therebetween.

The removal process of the lower semiconductor layer LS may include a chemical mechanical polishing process. The channel semiconductor layer CP may be exposed by the removal process of the lower semiconductor layer LS. For example, the removal process of the lower semiconductor layer LS may be performed to remove a portion of the data storing layer DS surrounding the channel semiconductor layer CP and thereby to expose an end of the channel semiconductor layer CP. In some example embodiments, the removal process of the lower semiconductor layer LS may be performed to remove the lower portions VS_B of the vertical structures shown in FIG. 10.

As described above, at least a portion of the buried insulating layer BX may remain on the cell array region CR, but in certain embodiments, the buried insulating layer BX may be removed from the cell array region CR and the buffer layer 111 may be exposed. In the case where the formation process of the recess region RR described with reference to FIG. 6 is used, a portion of the substrate 100 (hereinafter, a residual substrate 103) may remain on the peripheral circuit region PR. The residual substrate 103 may include the bottom surface 103b, which is exposed in an upward direction, and the top surface 103a, which is opposite to the bottom surface 103b. The bottom surface 103b of the residual substrate 103 may be a bottom surface of the buried insulating layer BX. The top surface 103a of the residual substrate 103 may be a top surface of the peripheral active layer UT.

Figure 12:
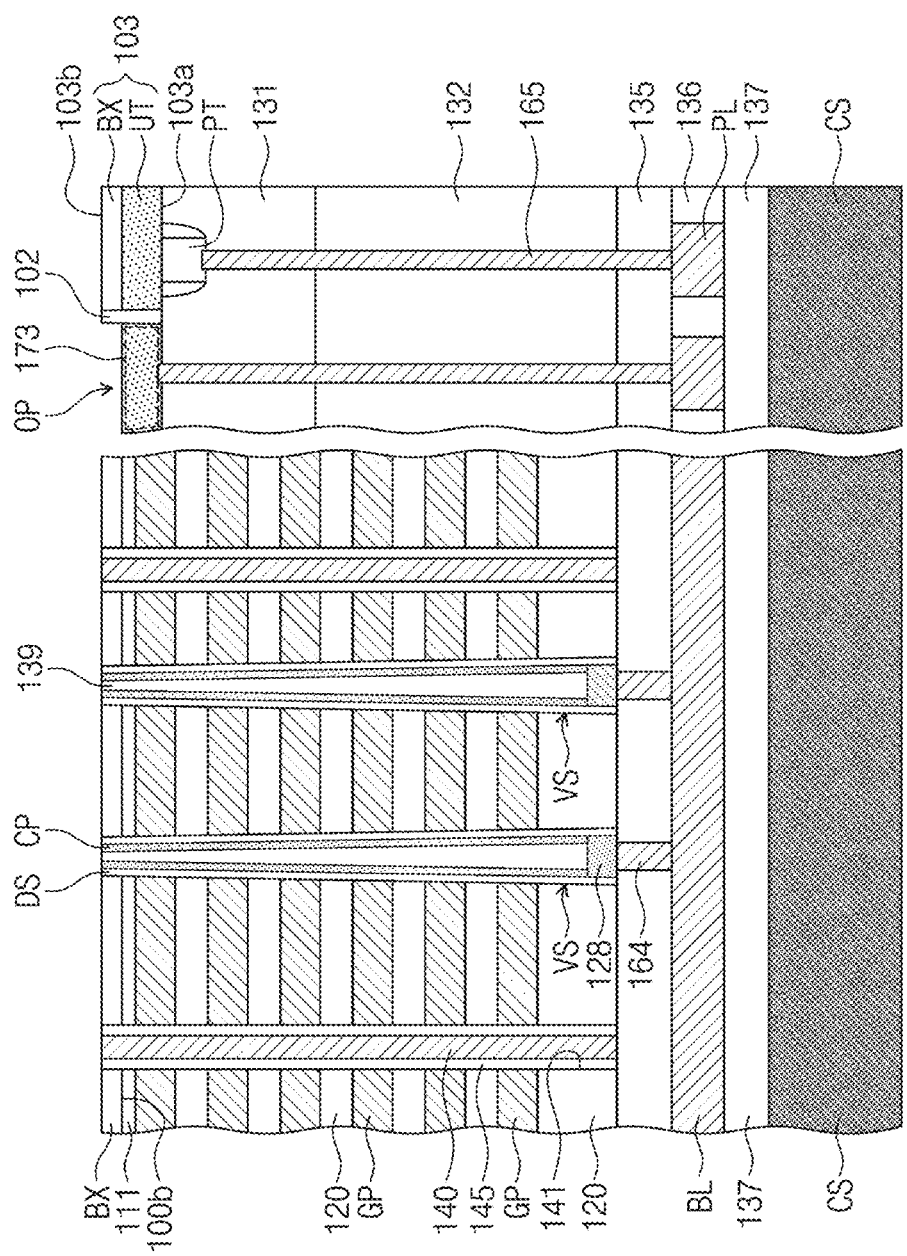

Referring to FIGS. 4 and 12, a portion of the buried insulating layer BX may be removed to form the opening OP exposing the pick-up impurity region 173. The formation of the opening OP may include a dry etching process. In certain embodiments, the formation of the pick-up impurity region 173 may include forming the opening OP to expose a portion of the peripheral active layer UT and then performing an ion implantation process on the exposed portion of the peripheral active layer UT.

Figure 13:
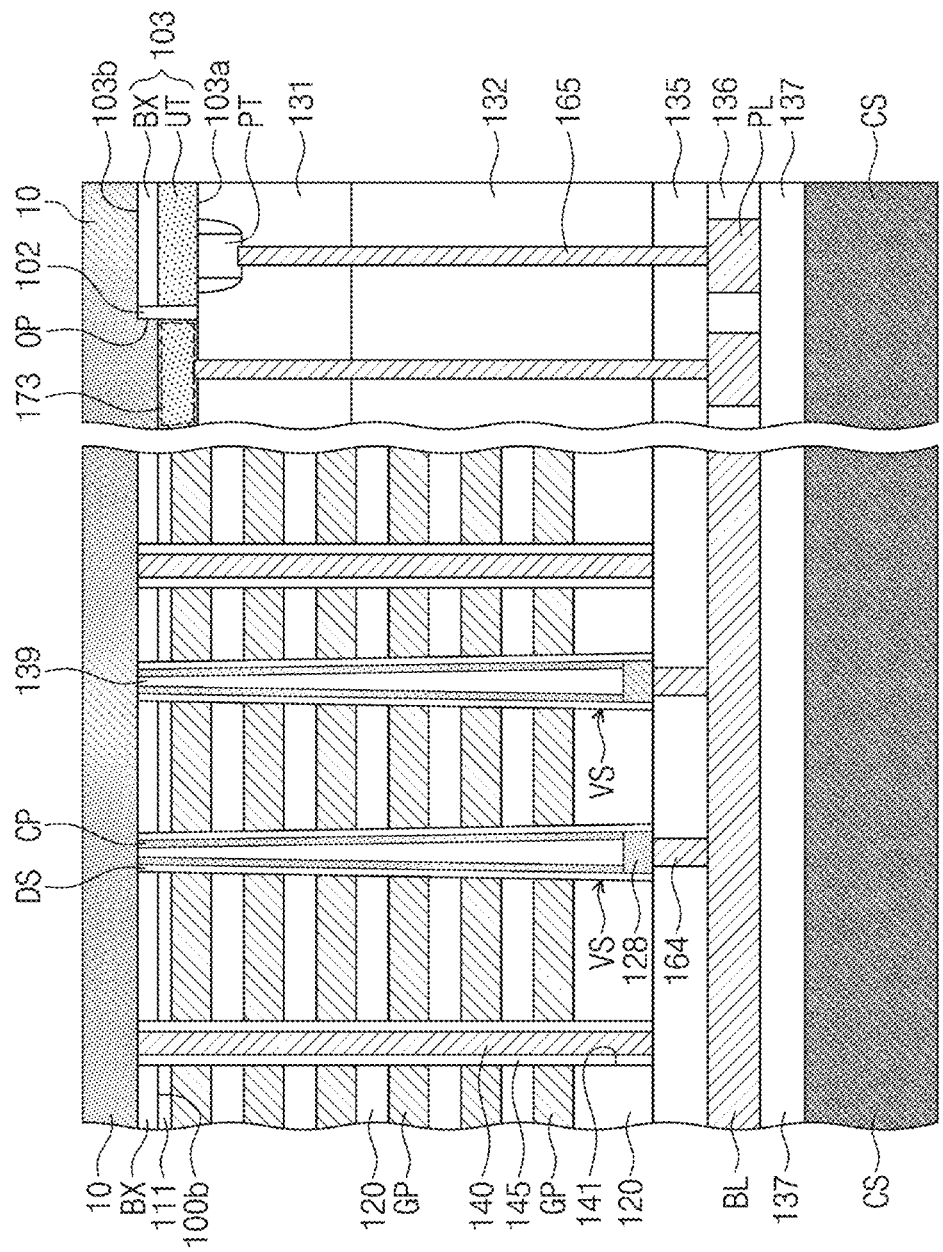

Referring to FIGS. 4 and 13, the body conductive layer 10 may be formed to cover the cell array region CR and the peripheral circuit region PR. The body conductive layer 10 may include a semiconductor material and/or a metal material. As an example, the body conductive layer 10 may be formed of poly silicon. The body conductive layer 10 may be doped to have a first conductivity type (for example, using an in-situ doping process). The body conductive layer 10 may be formed using a chemical vapor deposition process or an atomic layer deposition process. As an example, the formation of the body conductive layer 10 may include forming an amorphous silicon layer and performing a thermal treatment process thereon. The thermal treatment process may be performed at a temperature ranging from about 700° C. to about 1000° C. In some example embodiments, the body conductive layer 10 may be formed to have a thickness ranging from about 5 nm to about 100 µm.

On the peripheral circuit region PR, the body conductive layer 10 may be formed on the bottom surface 103b of the residual substrate 103. The body conductive layer 10 may be extended into the opening OP and may be connected to the pick-up impurity region 173. On the cell array region CR, the body conductive layer 10 may be connected to the channel semiconductor layers CP. As an example, the body conductive layer 10 may be in direct contact with the channel semiconductor layers CP. After the formation of the body conductive layer 10, a planarization process (e.g., a chemical mechanical polishing process) may be further performed, and in certain embodiments, such a planarization process may be omitted.

Figure 14:
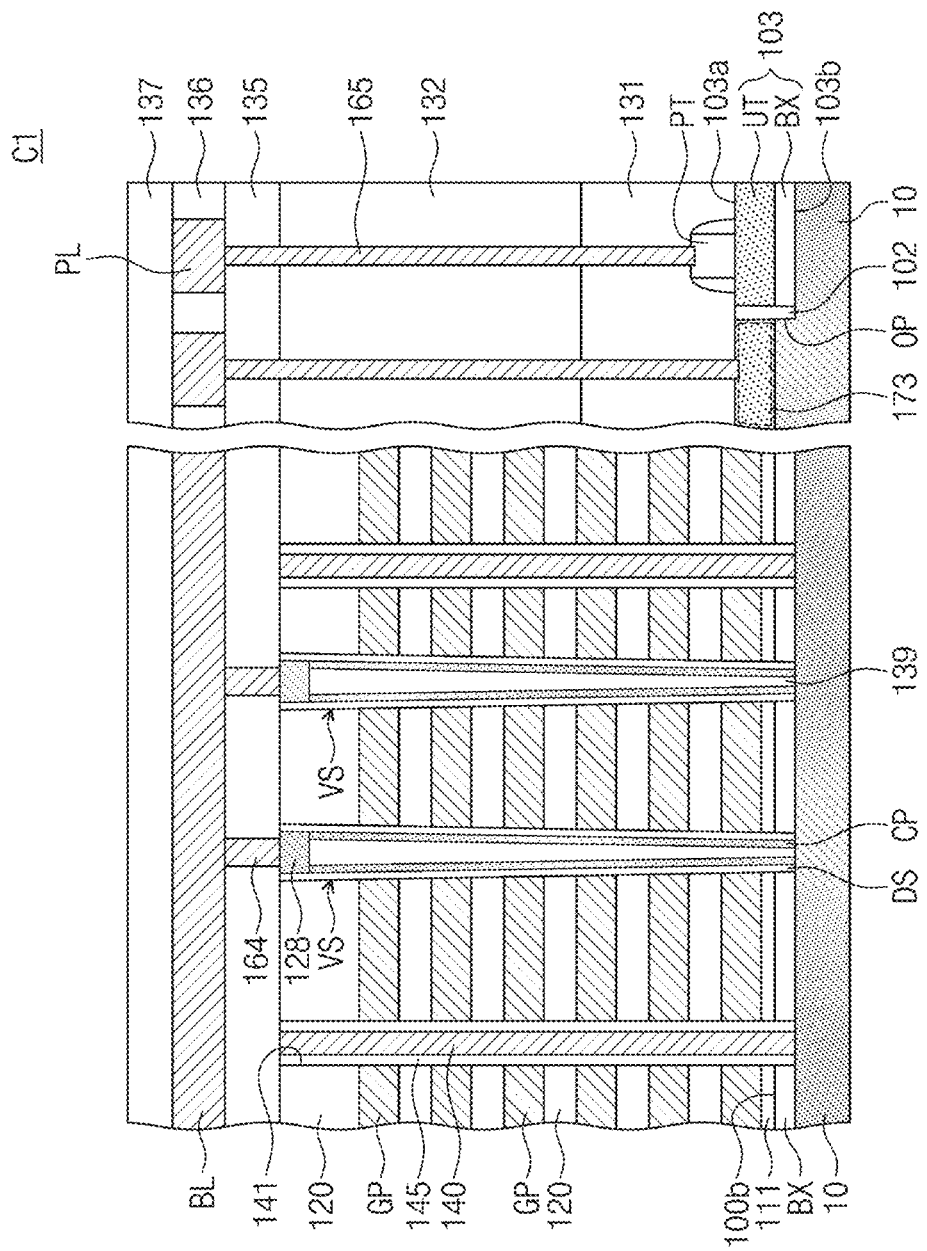

Referring to FIGS. 4 and 14, the carrier substrate CS may be removed. Next, additional processes may be performed to finish the process of fabricating the first semiconductor chip C1. Thereafter, as described with reference to FIGS. 2A and 2B, the first and second semiconductor chips C1 and C2 may be bonded to each other, thereby forming the semiconductor memory device ME.

Figure 15:
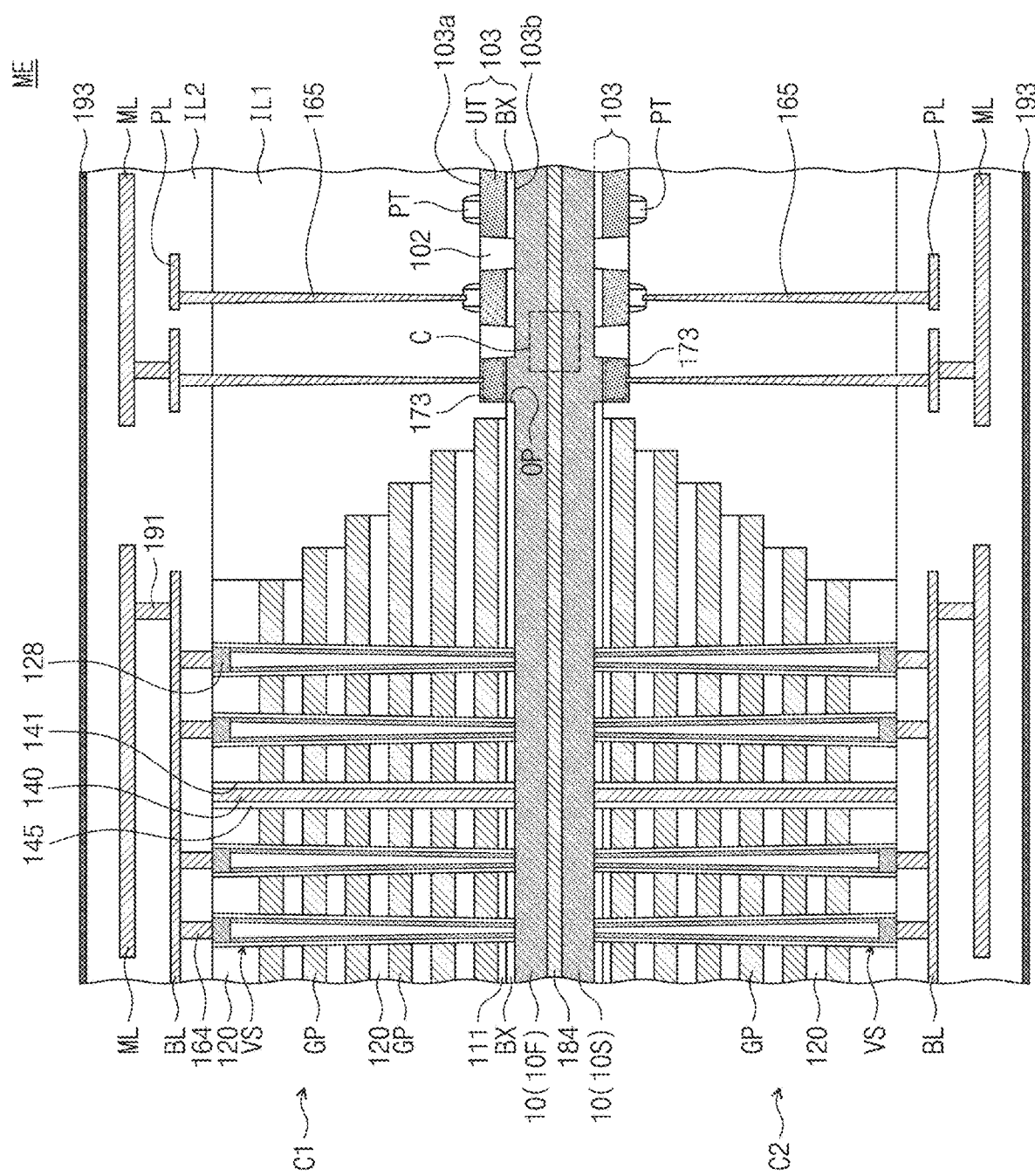
FIG. 15 is a sectional view illustrating a semiconductor memory device according to some example embodiments of the inventive concepts.
Figure 16:
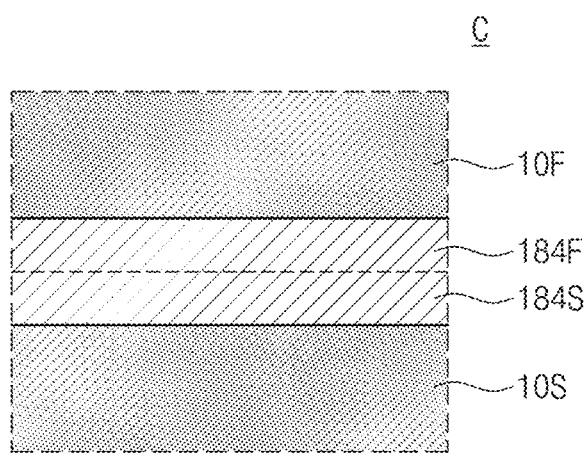
FIG. 16 is an enlarged view illustrating a region 'C' of FIG. 15.

FIG. 15 is a sectional view illustrating a semiconductor memory device according to some example embodiments of the inventive concepts. FIG. 16 is an enlarged view illustrating a region 'C' of FIG. 15. For concise description, a previously described element may be identified by the same reference number without repeating an overlapping description thereof.

Referring to FIGS. 15 and 16, the semiconductor memory device ME according to some example embodiments may further include an inter-chip layer 184, which is provided between the first body conductive layer 10F of the first semiconductor chip C1 and the second body conductive layer 10S of the second semiconductor chip C2. The inter-chip layer 184 may be a conductive layer. The first body conductive layer 10F and the second body conductive layer 10S may be electrically connected to each other through the inter-chip layer 184. As an example, the inter-chip layer 184 may be formed of or include at least one of metallic materials (e.g., copper, aluminum, and gold). In certain embodiments, the inter-chip layer 184 may be an insulating layer that is formed of or include (e.g., at least partially comprises) at least one of insulating materials (e.g., silicon oxide, silicon nitride, and silicon oxynitride).

The inter-chip layer 184 may be formed by depositing or attaching a conductive layer on at least one of the first and second body conductive layers 10F and 10S, before the step of ("prior to") bonding the first semiconductor chip C1 to the second semiconductor chip C2. As an example, the first inter-chip layer 184F may be formed on the first body conductive layer 10F, and the second inter-chip layer 184S may be formed on the second body conductive layer 10S. The first and second inter-chip layers 184F and 184S may be bonded to each other by pressure and heat, which is provided in the step of bonding the first semiconductor chip C1 to the second semiconductor chip C2.

Figure 17:
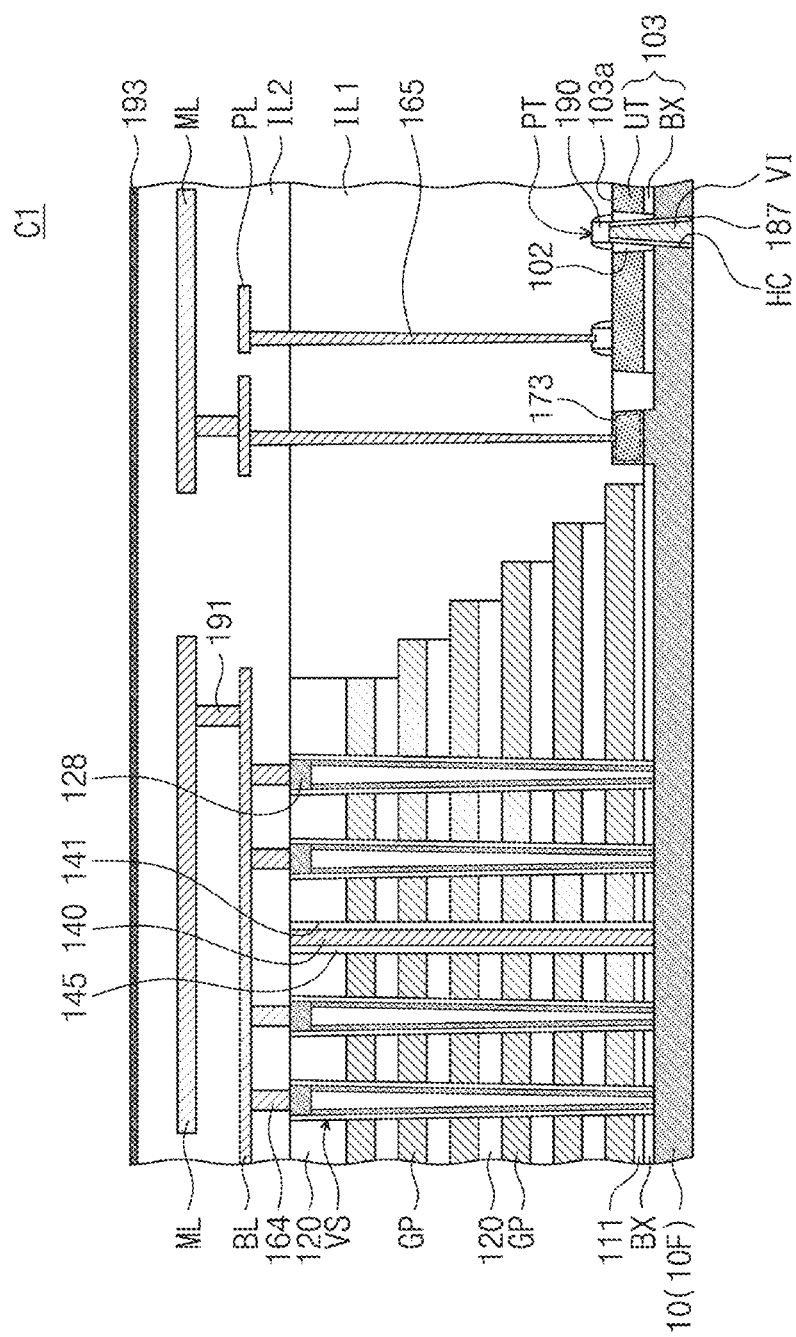
FIG. 17 is a sectional view illustrating a first semiconductor chip according to some example embodiments of the inventive concepts.
Figure 18:
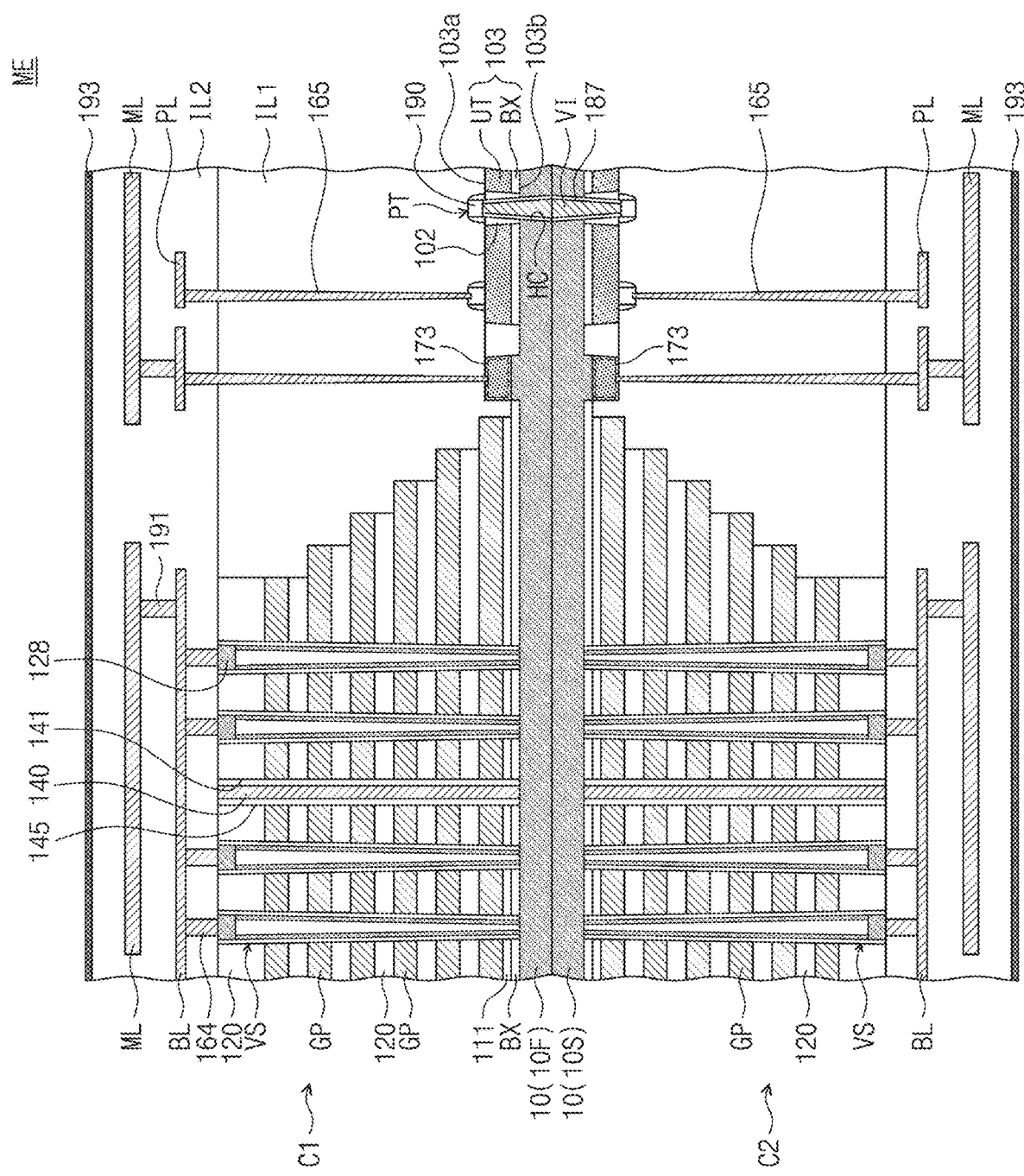
FIG. 18 is a sectional view illustrating a semiconductor memory device according to some example embodiments of the inventive concepts.

FIG. 17 is a sectional view illustrating a first semiconductor chip according to some example embodiments of the inventive concepts. FIG. 18 is a sectional view illustrating a semiconductor memory device according to some example embodiments of the inventive concepts. For concise description, a previously described element may be identified by the same reference number without repeating an overlapping description thereof.

Referring to FIG. 17, a through electrode VI may be formed ("located") in the first semiconductor chip C1. A contact hole HC may be formed to penetrate ("extend through") the first body conductive layer 10F. As an example, the contact hole HC may be formed to penetrate ("extend through") the residual substrate 103 and to expose the peripheral transistor PT (e.g., the bottom surface of the gate electrode of the peripheral transistor PT, said gate electrode being referred to herein as a peripheral gate electrode 190). An isolation insulating layer 187 may be formed to cover a side surface of the contact hole HC, and then, the through electrode VI may be formed to penetrate ("extend through") the isolation insulating layer 187. The through electrode VI may be connected to the gate electrode ("peripheral gate electrode 190") of the peripheral transistor PT. The through electrode VI may be electrically disconnected ("electrically isolated," "electrically insulated," etc.) from the first body conductive layer 10F by the isolation insulating layer 187. The through electrode VI may be formed of or include at least one of metals, conductive metal nitrides, or doped semiconductor materials. The isolation insulating layer 187 may be formed of silicon oxide. The contact hole HC extending through the first body conductive layer 10F and the residual substrate 103 of the first semiconductor chip C1 may be formed prior to bonding the second semiconductor chip C2 to the first semiconductor chip C1. Similarly, the contact hole HC extending through the second body conductive layer 10S and the residual substrate 103 of the second semiconductor chip C2 may be formed prior to bonding the first semiconductor chip C1 to the second semiconductor chip C2.

Referring to FIG. 18, the first and second semiconductor chips C1 and C2 may be bonded to each other. The second semiconductor chip C2 may be configured to have substantially the same or similar features as the first semiconductor chip C1 described with reference to FIG. 17. In the bonding step, the through electrode VI of the first semiconductor chip C1 may be bonded to the through electrode VI of the second semiconductor chip C2 and thereby may be electrically connected to each other. The first and second semiconductor chips C1 and C2 may be electrically connected to each other by the through electrodes VI. Restated, and as shown in FIG. 18, a bottom surface of the through electrode VI of the first semiconductor chip C1 may be in contact (e.g., "direct contact") with a bottom surface of the through electrode VI of the second semiconductor chip C2.

Figure 19:
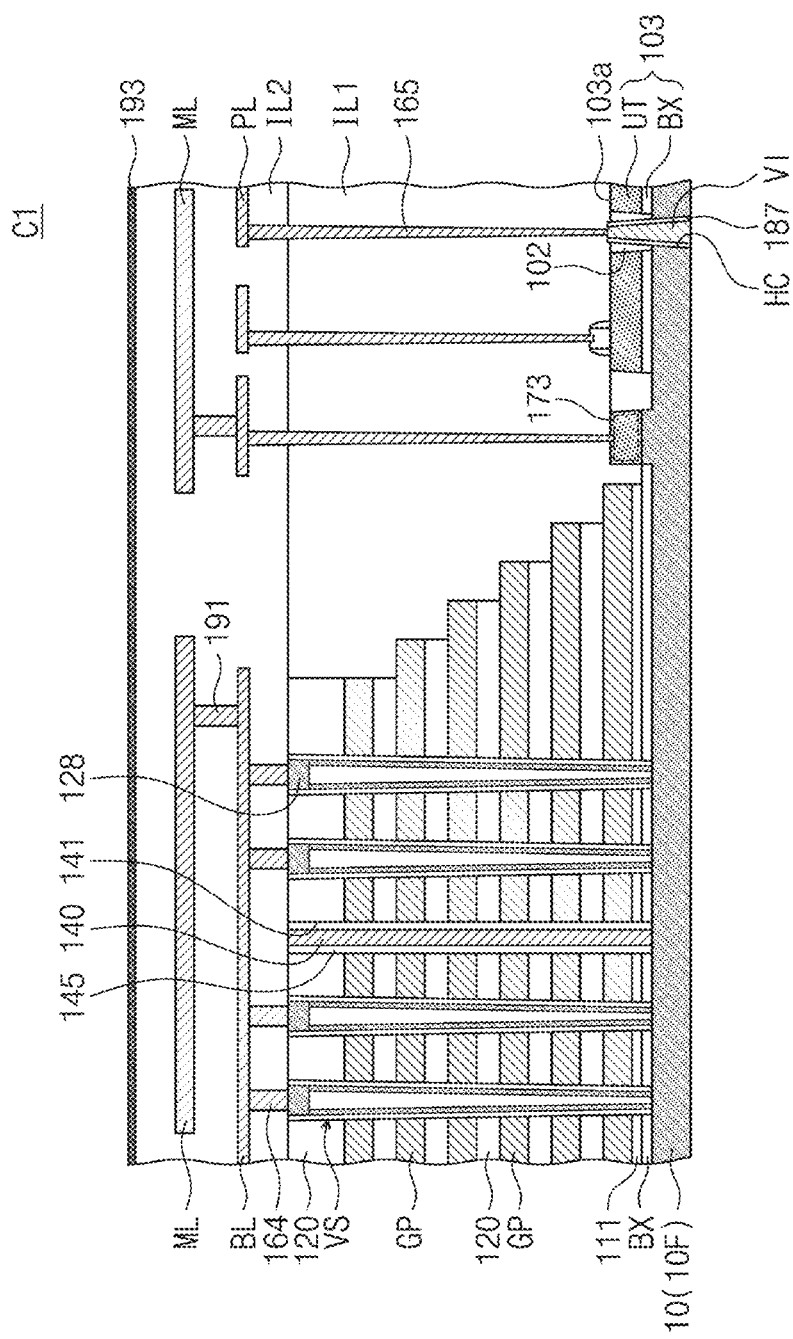
FIG. 19 is a sectional view illustrating a first semiconductor chip according to some example embodiments of the inventive concepts.
Figure 20:
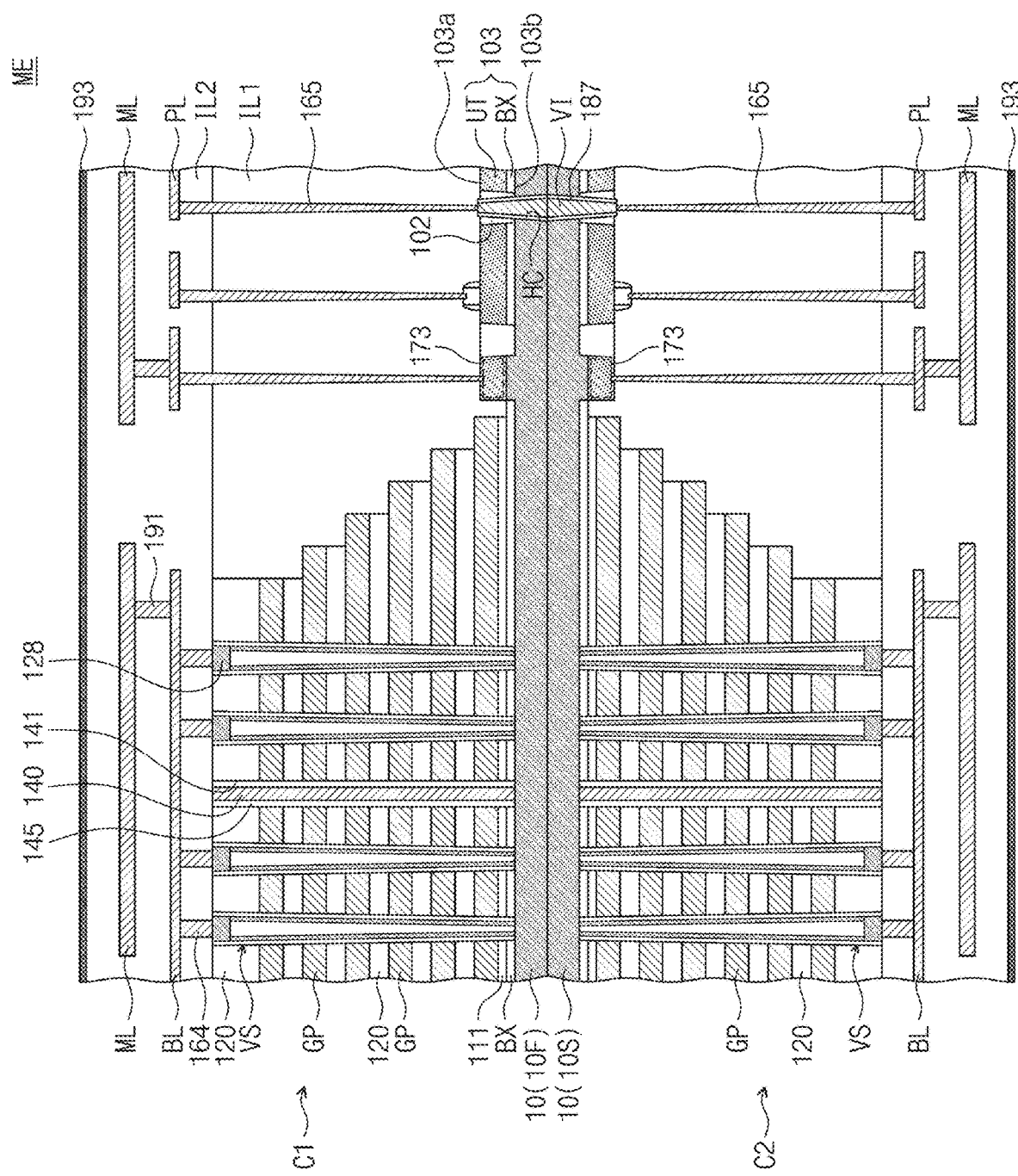
FIG. 20 is a sectional view illustrating a semiconductor memory device according to some example embodiments of the inventive concepts.

FIG. 19 is a sectional view illustrating a first semiconductor chip according to some example embodiments of the inventive concepts. FIG. 20 is a sectional view illustrating a semiconductor memory device according to some example embodiments of the inventive concepts. For concise description, a previously described element may be identified by the same reference number without repeating an overlapping description thereof.

Referring to FIG. 19, the through electrode VI may be formed in the first semiconductor chip C1. The contact hole HC may be formed to penetrate the first body conductive layer 10F. As an example, the contact hole HC may be formed to penetrate the residual substrate 103 and to expose the bottom surface of the peripheral contact 165. As shown in FIG. 19, the isolation insulating layer 187 may be formed to cover a side surface of the contact hole HC, and then, the through electrode VI may be formed to penetrate the isolation insulating layer 187. Restated, the isolation insulating layer 187 may be formed on a side surface of the contact hole HC prior to forming the through electrode VI. The through electrode VI may be connected to the peripheral contact 165.

Referring to FIG. 20, the first and second semiconductor chips C1 and C2 may be bonded to each other. The second semiconductor chip C2 may be configured to have substantially the same or similar features as the first semiconductor chip C1 described with reference to FIG. 19. In the bonding step, the through electrode VI of the first semiconductor chip C1 may be bonded to the through electrode VI of the second semiconductor chip C2 and thereby may be electrically connected to each other. The first and second semiconductor chips C1 and C2 may be electrically connected to each other by the through electrodes VI.

FIGS. 21 to 28 are sectional views taken along line I-I' of FIG. 4 to illustrate a semiconductor memory device according to some example embodiments of the inventive concepts. For brevity of description, explanations of duplicate components will be omitted.

Figure 21:
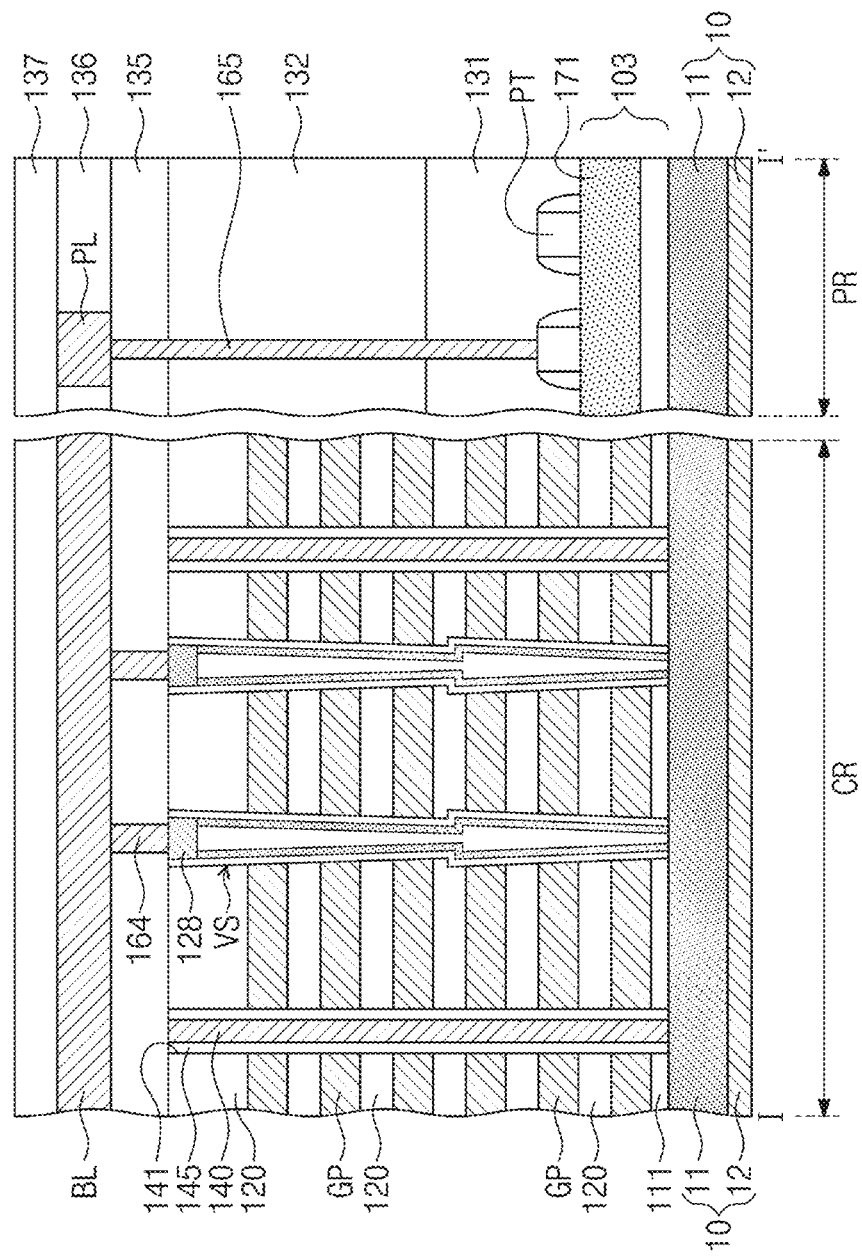
FIGS. 21 to 28 are sectional views taken along line I-I' of FIG. 4 to illustrate a semiconductor memory device according to some example embodiments of the inventive concepts.

Referring to FIG. 21, a polycrystalline semiconductor layer 11 and a metal layer 12 may be included in the body conductive layer 10 of a semiconductor memory device according to some example embodiments of inventive concepts. The metal layer 12 may be spaced apart from the vertical structures VS across the polycrystalline semiconductor layer 11. For example, the polycrystalline semiconductor layer 11 may be a polycrystalline silicon layer. The metal layer 12 may include one or more of tungsten, titanium, tantalum, and any conductive nitride thereof. The metal layer 12 may be formed thinner the polycrystalline semiconductor layer 11. For example, the metal layer 12 may be formed by sputtering. In some embodiments, a plurality of etching processes may be performed to form vertical holes for forming the vertical structures VS, and as a result, the vertical structures VS may have portions whose width increases or decreases discontinuously.

Figure 22:
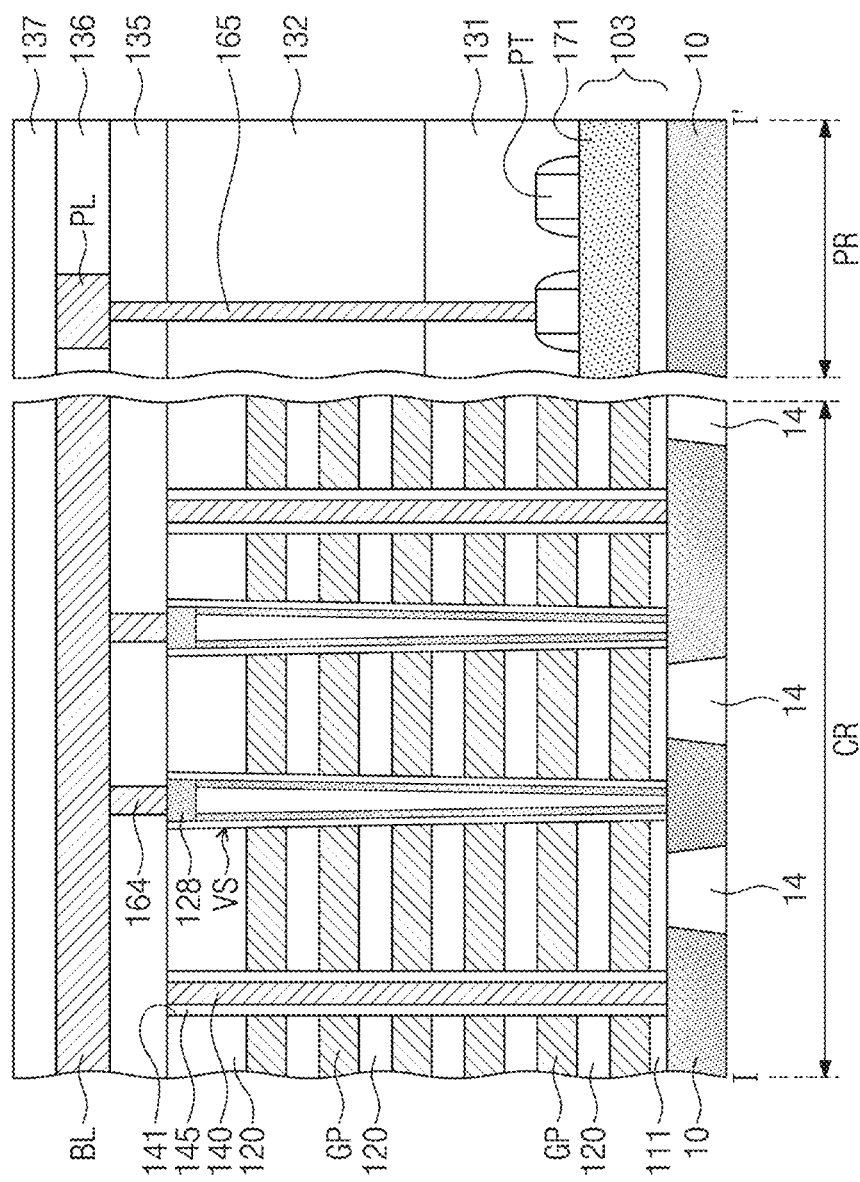

Referring to FIG. 22, insulation patterns 14 may be included in the body conductive layer 10 of a semiconductor memory device according to some example embodiments of inventive concepts. For example, the insulation patterns 14 may penetrate the body conductive layer 10. The insulation patterns 14 may include one or more of silicon oxide, silicon nitride, and silicon oxynitride. The formation of the insulation patterns 14 may include forming the body conductive layer 10, etching the body conductive layer 10 to form trenches, and filling the trenches with an insulating material.

Figure 23:
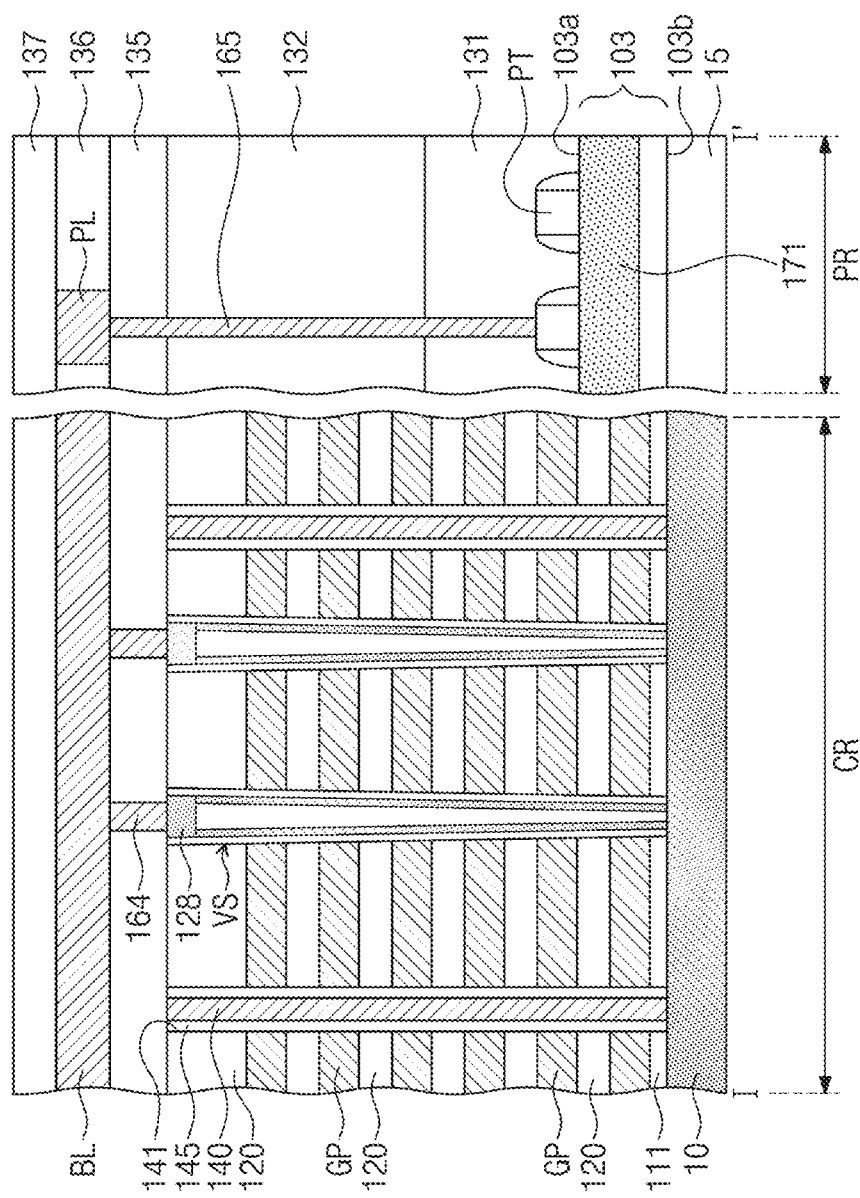

Referring to FIG. 23, the peripheral circuit region PR may be provided with a layer whose type is different from that of the body conductive layer 10. For example, an insulation pattern 15 may be provided to contact the bottom surface 103b of the residual substrate 103. The insulation pattern 15 may include one or more of silicon oxide, silicon nitride, and silicon oxynitride. The formation of the insulation pattern 15 may include removing the body conductive layer 10 on the peripheral circuit region PR to form a space on the peripheral circuit region PR and filling the space with an insulating material.

Figure 24:
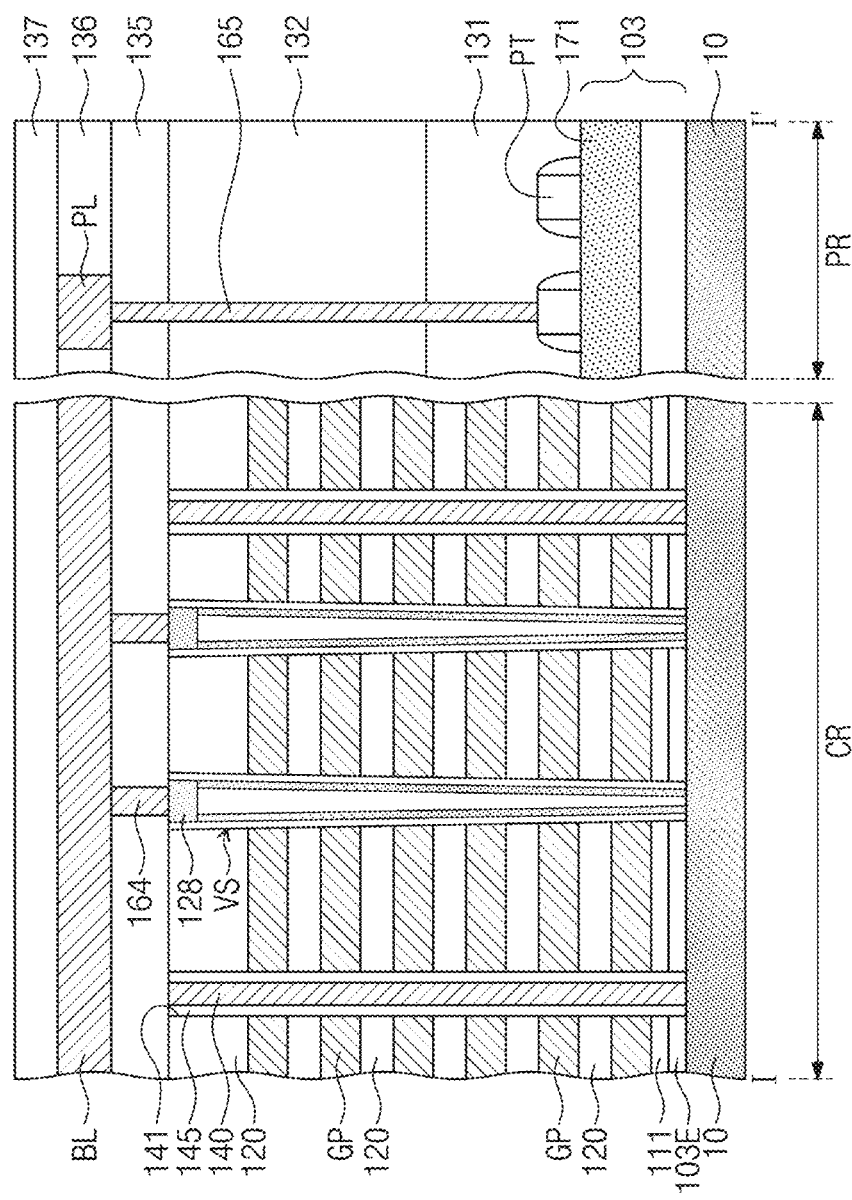

Referring to FIG. 24, the residual substrate 103 may extend onto the cell array region CR from the peripheral circuit region PR. For example, the residual substrate 103 may leave a remaining portion 103E on the cell array region CR. The residual substrate 103 on the peripheral circuit region PR may have a thickness greater than that of the remaining portion 103E on the cell array region CR.

Figure 25:
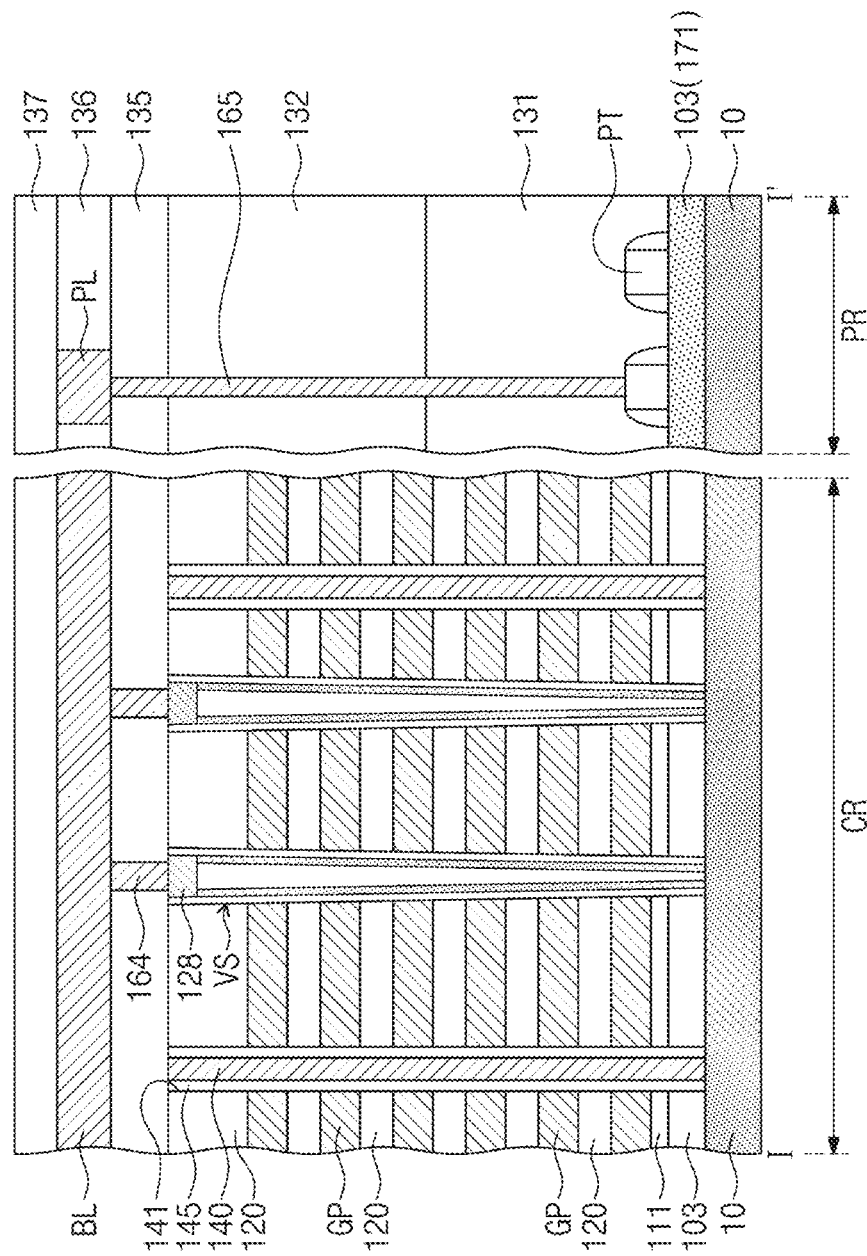

Referring to FIG. 25, the residual substrate 103 may extend onto the cell array region CR from the peripheral circuit region PR. The cell array region CR and the peripheral circuit region PR may be provided thereon with the semiconductor substrate 100 having substantially the same thickness.

Figure 26:
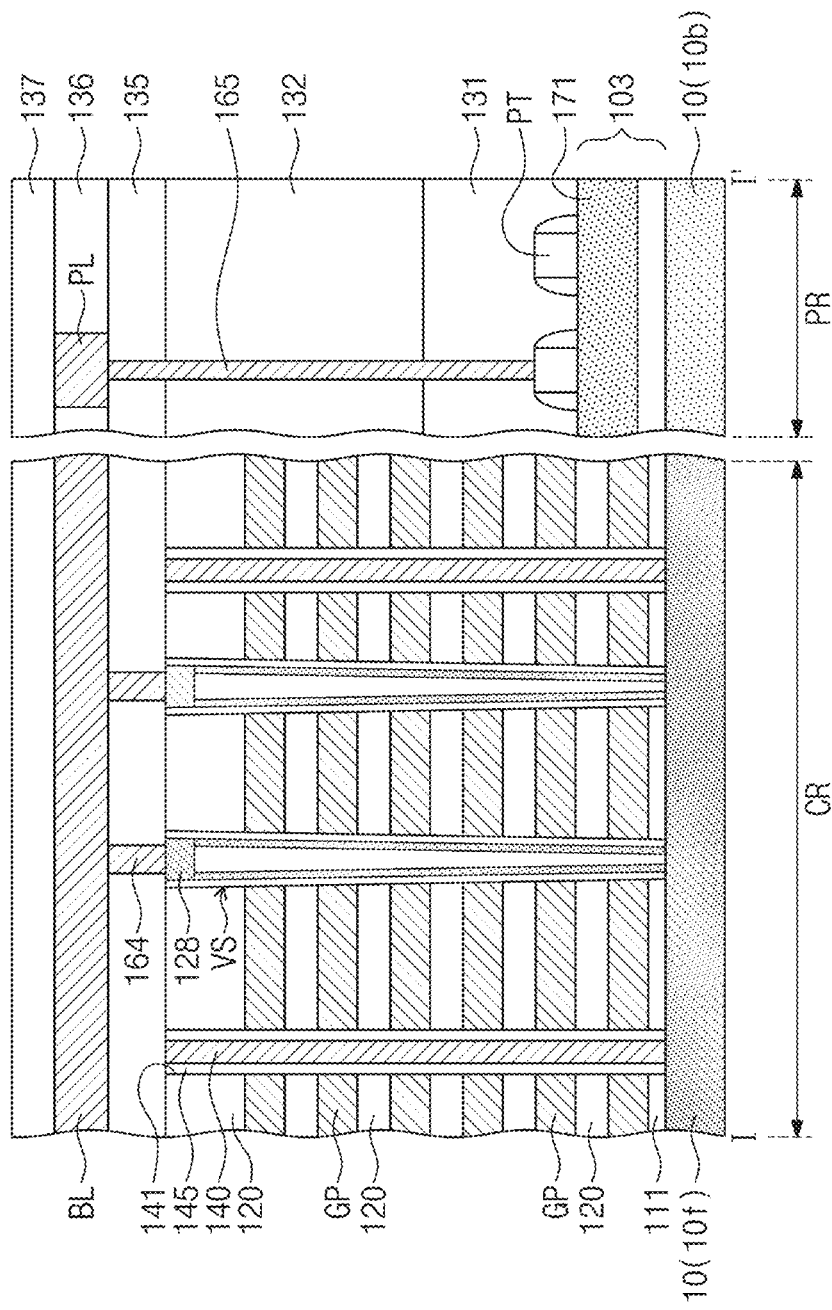

Referring to FIG. 26, according to some example embodiments of inventive concepts, the body conductive layer 10 may have a different impurity concentration between the cell array region CR and the peripheral circuit region PR. For example, an impurity concentration of a body conductive layer 10f on the cell array region CR may be greater than an impurity concentration of a body conductive layer 10b on the peripheral circuit region PR. For example, the impurity concentration of the body conductive layer 10f on the cell array region CR may be about 5 times to about 10 times greater than the impurity concentration of the body conductive layer 10b on the peripheral circuit region PR. The body conductive layer 10f may be formed and then partially removed to form the body conductive layer 10b of the peripheral circuit region PR.

Figure 27:
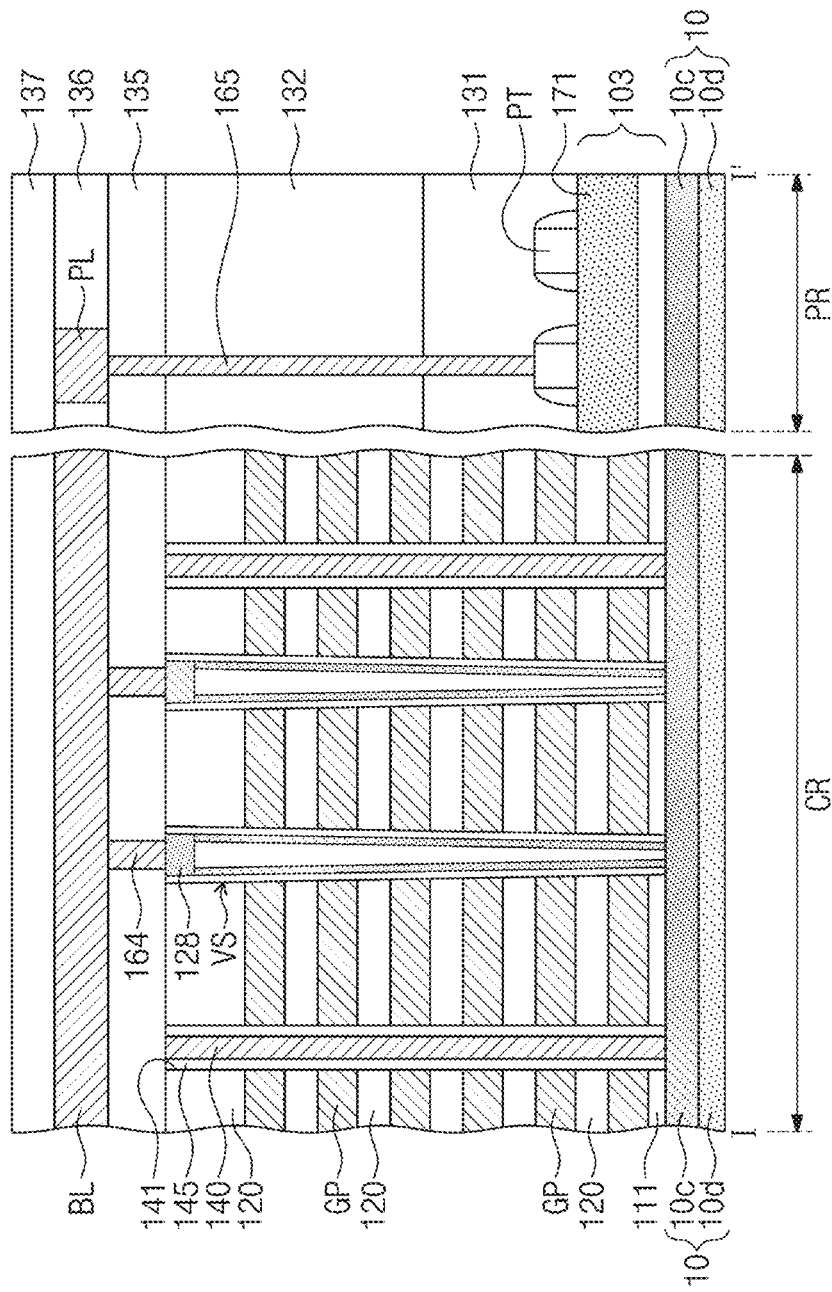

Referring to FIG. 27, according to some example embodiments of inventive concepts, the body conductive layer 10 may include a first semiconductor layer 10c and a second semiconductor layer 10d that have different impurity concentrations from each other. The second semiconductor layer 10d may be spaced apart from the vertical structures VS across the first semiconductor layer 10c. The first semiconductor layer 10c may have an impurity concentration greater than that of the second semiconductor layer 10d. For example, the impurity concentration of the first semiconductor layer 10c may be about 5 times to about 100 times greater than the impurity concentration of the second semiconductor layer 10d. The first and second semiconductor layers 10c and 10d may be formed to have different impurity concentrations by adjusting an impurity doping concentration in an in-situ process.

Figure 28:
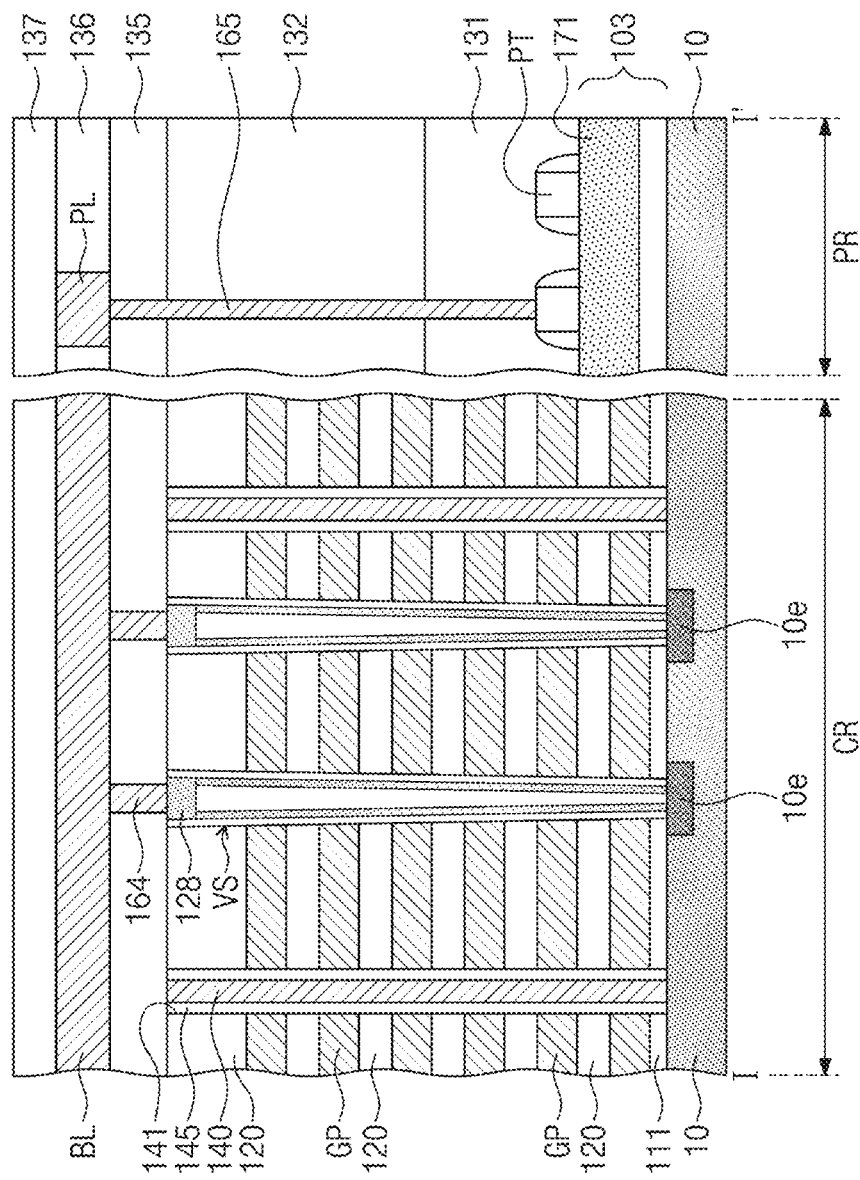

Referring to FIG. 28, according to some example embodiments of inventive concepts, the body conductive layer 10 may include impurity regions 10e that are locally formed therein. For example, the impurity regions 10e may be formed below the vertical structures VS. After the body conductive layer 10 is formed, an ion implantation process may be performed to form the impurity regions 10e. The impurity regions 10e may each have an impurity concentration greater than that of the body conductive layer 10. For example, each impurity concentration of the impurity regions 10e may be about 5 times to about 100 times greater than the impurity concentration of the body conductive layer 10.

According to some example embodiments of the inventive concepts, it may be possible to provide a method capable of simplifying a fabrication process of a semiconductor memory device and or improving reliability of a semiconductor memory device. According to some example embodiments of the inventive concepts, it may be possible to reduce a thickness of a semiconductor memory device.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor memory device, the method comprising:
   preparing a first semiconductor chip and a second semiconductor chip, wherein each semiconductor chip of the first semiconductor chip and the second semiconductor chip includes a plurality of electrodes sequentially stacked on a body conductive layer and a plurality of vertical structures extending through the electrodes and connected to the body conductive layer,
   bonding the second semiconductor chip to the first semiconductor chip such that respective bottom surfaces of the body conductive layers of the first and second semiconductor chips face each other.

2. The method of claim 1, further comprising:
   forming an inter-chip layer on at least one bottom surface of the respective bottom surfaces of the body conductive layers of the first and second semiconductor chips prior to bonding the second semiconductor chip to the first semiconductor chip.

3. The method of claim 2, wherein the inter-chip layer is a conductive layer.

4. The method of claim 3, wherein the inter-chip layer comprises at least one of copper, aluminum, and gold.

5. The method of claim 2, wherein the inter-chip layer is an insulating layer.

6. The method of claim 5, wherein the inter-chip layer comprises at least one of silicon oxide, silicon nitride, and silicon oxynitride.

7. The method of claim 1, further comprising:
forming a contact hole extending through the body conductive layer of the first semiconductor chip prior to bonding the second semiconductor chip to the first semiconductor chip; and
forming a through electrode in the contact hole.

8. The method of claim 7, further comprising:
forming an isolation insulating layer on a side surface of the contact hole prior to forming the through electrode.

9. The method of claim 1, wherein the bottom surface of the body conductive layer of the first semiconductor chip is in direct contact with the bottom surface of the body conductive layer of the second semiconductor chip.

10. The method of claim 1, wherein preparing the first semiconductor chip comprises:
forming the plurality of electrodes and the plurality of vertical structures on a substrate; and
removing at least a portion of the substrate,
wherein removing the substrate comprises a chemical mechanical polishing process.

11. The method of claim 10, wherein removing at least a portion of the substrate comprises removing lower portions of the vertical structures.

12. The method of claim 11, wherein the vertical structures comprise channel semiconductor layers, ends of the channel semiconductor layers are exposed during removing at least a portion of the substrate.

13. The method of claim 1, wherein bonding the second semiconductor chip to the first semiconductor chip comprises applying pressure and heat to the first and second semiconductor chips.

14. The method of claim 1, wherein a process temperature is about 300° C. to about 600° C. during bonding the second semiconductor chip to the first semiconductor chip.

15. The method of claim 1, wherein the body conductive layer includes poly silicon.

16. A method of fabricating a semiconductor memory device, the method comprising:
preparing a first semiconductor chip and a second semiconductor chip; and
bonding the second semiconductor chip to the first semiconductor chip,
wherein the preparing the first semiconductor chip and the second semiconductor chip includes:
forming a plurality of electrodes and a plurality of vertical structures extending through the electrodes on a substrate;
removing at least a portion of the substrate; and
forming a body conductive layer including poly silicon connected to the plurality of vertical structures,
wherein the second semiconductor chip and the first semiconductor chip are bonded such that respective bottom surfaces of the body conductive layers of the first and second semiconductor chips face each other.

17. The method of claim 16, wherein the vertical structures comprise channel semiconductor layers, ends of the channel semiconductor layers are exposed during removing at least a portion of the substrate.

18. The method of claim 16, wherein bonding the second semiconductor chip to the first semiconductor chip comprises applying pressure and heat to the first and second semiconductor chips.

19. The method of claim 16, wherein removing at least a portion of the substrate includes:
providing a carrier substrate; and
inverting the carrier substrate to allow a bottom surface of the substrate to be oriented upward.

20. The method of claim 16, wherein removing at least a portion of the substrate includes a chemical mechanical polishing process,
wherein the portions of the vertical structures are removed during the chemical mechanical polishing process.

* * * * *